US010074826B2

(12) United States Patent
Park et al.

(10) Patent No.: US 10,074,826 B2
(45) Date of Patent: Sep. 11, 2018

(54) DISPLAY APPARATUS AND METHOD OF MANUFACTURING THE SAME

(71) Applicant: Samsung Display Co., Ltd., Yongin-Si, Gyeonggi-Do (KR)

(72) Inventors: Eungseok Park, Yongin-si (KR); Minho Oh, Yongin-si (KR); Wonmin Yun, Yongin-si (KR); Byoungduk Lee, Yongin-si (KR); Yunah Chung, Yongin-si (KR); Yoonhyeung Cho, Yongin-si (KR); Yongchan Ju, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/270,536

(22) Filed: Sep. 20, 2016

(65) Prior Publication Data

US 2017/0098798 A1 Apr. 6, 2017

(30) Foreign Application Priority Data

Oct. 6, 2015 (KR) .................. 10-2015-0140612
Mar. 24, 2016 (KR) .................. 10-2016-0035533

(51) Int. Cl.
*H01L 51/52* (2006.01)
*H01L 27/32* (2006.01)

(52) U.S. Cl.
CPC ...... *H01L 51/5253* (2013.01); *H01L 27/3211* (2013.01); *H01L 27/3244* (2013.01); *H01L 2227/323* (2013.01); *H01L 2251/5338* (2013.01)

(58) Field of Classification Search
None
See application file for complete search history.

(56) References Cited

U.S. PATENT DOCUMENTS 9,257,674 B2 * 2/2016 Lee .................. H01L 51/5268
9,306,189 B2 4/2016 Lee et al.
2004/0212759 A1 10/2004 Hayashi
2009/0009046 A1 1/2009 Oh et al.
(Continued)

FOREIGN PATENT DOCUMENTS

KR 1020040086556 A 10/2004
KR 1020090000314 A 1/2009
(Continued)

OTHER PUBLICATIONS

Choi, et al., Stretchable Organic Thin-Film Transistors Fabricated on Wavy-Dimensional Elastomer Substrates Using Stiff-Island Structures, IEEE Electron Device Letters, vol. 35, No. 7, Jul. 2014, pp. 762-764.
(Continued)

Primary Examiner — Joseph Schoenholtz
(74) Attorney, Agent, or Firm — Cantor Colburn LLP

(57) ABSTRACT

A display apparatus includes a substrate, a display element disposed on the substrate, a first inorganic film layer disposed on the display element, a first organic film layer disposed on the first inorganic film layer, a second organic film layer disposed on the first organic film layer and including a wrinkled upper surface, and a second inorganic film layer disposed on the second organic film layer and including a shape corresponding to the wrinkled upper surface of the second organic film layer.

32 Claims, 12 Drawing Sheets

(56) References Cited

U.S. PATENT DOCUMENTS

| | | | | |
|---|---|---|---|---|
| 2011/0198620 A1* | 8/2011 | Han | ........................ | H05B 33/04 |
| | | | | 257/88 |
| 2012/0256202 A1* | 10/2012 | Lee | .................... | H01L 51/5256 |
| | | | | 257/88 |
| 2014/0065739 A1* | 3/2014 | Chen | ........................ | H01L 51/56 |
| | | | | 438/26 |
| 2015/0173186 A1 | 6/2015 | Na et al. | | |
| 2015/0228924 A1 | 8/2015 | Sato et al. | | |

FOREIGN PATENT DOCUMENTS

| | | | |
|---|---|---|---|
| KR | 1020120113555 A | 10/2012 | |
| KR | 1020120138037 A | 12/2012 | |
| KR | 1020140088335 A | 7/2014 | |
| KR | 1020150021887 A | 3/2015 | |

OTHER PUBLICATIONS

Kim, et al., Stretchable and Foldable Silicon Integrated Circuits, Science, vol. 320, Apr. 25, 2008, pp. 507-511 (Including Supporting Online Material for Stretchable and Foldable Silicon Integrated Circuits).
Kim, et al., Stretchable Electronics: Materials Strategies and Devices, Advanced Materials, 2008, 20, pp. 4887-4892.
Korean Office Action for Application No. 10-2016-0035533 dated March 30, 2018, citing the above reference(s). In conformance with MPEP 609—Concise explanation of the relevance includes issue date of KR OA and references cited therein.

* cited by examiner

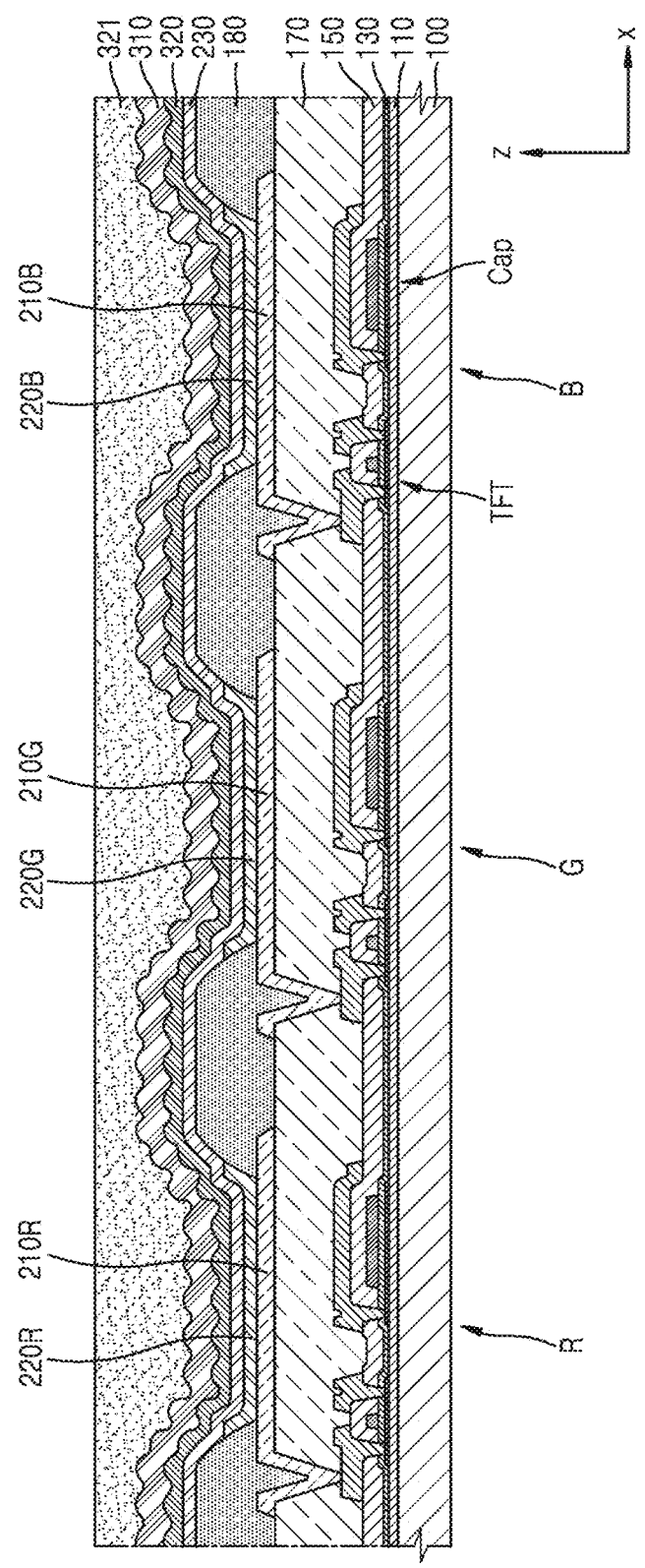

DISPLAY APPARATUS AND METHOD OF MANUFACTURING THE SAME

This application claims priority to Korean Patent Application No. 10-2015-0140612, filed on Oct. 6, 2015, and Korean Patent Application No. 10-2016-0035533, filed on Mar. 24, 2016, and all the benefits accruing therefrom under 35 U.S.C. § 119, the content of which in their entireties are herein incorporated by reference.

BACKGROUND

1. Field

One or more exemplary embodiments relate to a display apparatus and a method of manufacturing the same, and more particularly, to a display apparatus having a flexible characteristic and effectively preventing a permeation of external impurities into a display element of the display apparatus, and a method of manufacturing the same.

2. Description of the Related Art

Generally, a display apparatus includes a structure in which a display element is disposed on a substrate, and an encapsulation film covers the display element to prevent damage to the display element by external oxygen or moisture.

SUMMARY

A conventional display apparatus has a problem that a flexible characteristic is degraded. That is, even when a substrate and a display element of the display apparatus have the flexible characteristic, the flexible characteristic of the entire display apparatus becomes degraded due to a low flexibility of an encapsulation film.

One or more exemplary embodiments include a display apparatus having a flexibility and effectively preventing a permeation of external impurities into a display element of the display apparatus, and a method of manufacturing the same.

Additional exemplary embodiments will be set forth in part in the description which follows and, in part, will be apparent from the description, or may be learned by practice of the presented embodiments.

According to one or more exemplary embodiments, a display apparatus may include a substrate, a display element disposed on the substrate, a first inorganic film layer covering the display element, a first organic film layer disposed on the first inorganic film layer, a second organic film layer disposed on the first organic film layer and including a wrinkled upper surface, and a second inorganic film layer disposed on the second organic film layer and including a shape corresponding to the wrinkled upper surface of the second organic film layer.

According to one or more exemplary embodiments, the second organic film layer may include hexamethyldisiloxane or polyacrylate.

According to one or more exemplary embodiments, a minimum thickness of the first organic film layer may be greater than a maximum thickness of the second organic film layer.

According to one or more exemplary embodiments, the second inorganic film layer may have a uniform thickness.

According to one or more exemplary embodiments, a hardness of the first organic film layer may be greater than a hardness of the second organic film layer.

According to one or more exemplary embodiments, a method of manufacturing a display apparatus may include forming a display element on the substrate, forming a first inorganic film layer to cover the display element, forming a second organic film layer on the first inorganic film layer, and forming a second inorganic film layer on the second organic film layer, such that wrinkles are provided on an upper surface of the second organic film layer, and then the second inorganic film layer includes a shape corresponding to the wrinkled upper surface of the second organic film layer.

According to one or more exemplary embodiments, the forming the second organic film layer may include forming the second organic film layer using hexamethyldisiloxane or polyacrylate.

According to one or more exemplary embodiments, the method may further include forming a first organic film layer on the first inorganic film layer, the first organic film layer having a flat upper surface, and the forming the second organic film layer may include forming the second organic film layer on the first organic film layer, the second organic film layer having a hardness lower than a hardness of the first organic film layer.

According to one or more exemplary embodiments, the forming the first organic film layer may include forming the first organic film layer having hexamethyldisiloxane according to a chemical vapor deposition ("CVD") method in a first ratio of $N_2O$ in an entire gas, and the forming the second organic film layer may include forming the second organic film layer having the hexamethyldisiloxane according to the CVD method in a second ratio of $N_2O$, which is different from the first ratio of $N_2O$ in the entire gas.

According to one or more exemplary embodiments, the forming the second organic film layer may include forming the second organic film layer using acrylate.

According to one or more exemplary embodiments, the forming the first organic film layer may include forming an acrylate layer and irradiating the acrylate layer with a first illumination of ultraviolet light to harden the acrylate layer, and the forming the second organic film layer may include forming another acrylate layer and irradiating the other acrylate layer with a second illumination of ultraviolet light, which is less than the first illumination of ultraviolet light, to harden the other acrylate layer.

According to one or more exemplary embodiments, the forming the first organic film layer may include forming an acrylate layer and irradiating the acrylate layer with ultraviolet light for a first time period to harden the acrylate layer, and the forming the second organic film layer may include forming another acrylate layer and irradiating the other acrylate layer with the ultraviolet light for a second time period, which is shorter than the first time period, to harden the other acrylate layer.

According to one or more exemplary embodiments, the forming the second organic film layer may include forming the second organic film layer having a maximum thickness which is less than a minimum thickness of the first organic film layer.

According to one or more exemplary embodiments, a display apparatus may include a substrate, a display element disposed over the substrate, a first buffer organic layer covering the display element and having wrinkles provided on an upper surface thereof, a first buffer inorganic layer disposed over the first buffer organic layer and having a shape corresponding to a shape of the upper surface of the first buffer organic layer, and a first organic film layer disposed over the first buffer inorganic layer and having a flattened upper surface.

According to one or more exemplary embodiments, the display apparatus may further include a second buffer organic layer disposed over the first organic film layer and having wrinkles provided on an upper surface thereof, and a second buffer inorganic layer disposed over the second buffer organic layer and having a shape corresponding to a shape of the upper surface of the second buffer organic layer.

According to one or more exemplary embodiments, the display apparatus may further include an inorganic film layer disposed over the first organic film layer and having a flattened upper surface.

According to one or more exemplary embodiments, the first buffer organic layer may include hexamethyldisiloxane acid or polyacylate.

According to one or more exemplary embodiments, the second buffer organic layer may include hexamethyldisiloxane acid or polyacylate.

According to one or more exemplary embodiments, the first buffer inorganic layer and the second buffer inorganic layer may include a uniform thickness.

According to one or more exemplary embodiments, a hardness of the first organic film layer may be greater than a hardness of the second buffer organic layer.

According to one or more exemplary embodiments, a method of manufacturing a display apparatus may include forming a display element over a substrate, and forming a first buffer organic layer covering the display element, the first buffer organic layer including wrinkles provided on an upper surface thereof.

According to one or more exemplary embodiments, the forming a first buffer inorganic layer over the first buffer organic layer, the first buffer inorganic layer including a shape corresponding to a shape of the upper surface of the first buffer organic layer, and forming a first organic film layer over the first buffer inorganic layer, the first organic film layer including a flattened upper surface.

According to one or more exemplary embodiments, the forming the first organic film layer may include forming the first organic film layer including hexamethyldisiloxane acid according to a CVD method using a first ratio of $N_2O$ in an entire gas, and the forming the first buffer organic layer may include forming the first buffer organic layer including hexamethyldisiloxane acid according to the CVD method using a second ratio of $N_2O$ lower than the first ratio in the entire gas.

According to one or more exemplary embodiments, the forming the first buffer organic layer may include forming the first buffer organic layer using acrylate.

According to one or more exemplary embodiments, the forming the first organic film layer may include disposing an acrylate layer and hardening the acrylate layer using ultraviolet light of a first brightness, and the forming the first buffer organic layer may include disposing an acrylate layer and hardening the acrylate layer using ultraviolet of a second brightness lower than the first brightness.

According to one or more exemplary embodiments, the forming the first organic film layer may include disposing an acrylate layer and irradiating ultraviolet light on the acrylate layer for a first time period, and the forming the first buffer organic layer may include disposing an acrylate layer and irradiating ultraviolet light on the acrylate layer for a second time period shorter than the first time period.

According to one or more exemplary embodiments, the method may further include forming a second buffer organic layer over the first organic film layer the second buffer organic layer having a hardness lower than that of the first organic film layer.

According to one or more exemplary embodiments, the method may further include forming a second buffer inorganic layer over the second buffer organic layer such that wrinkles are provided on an upper surface of the second buffer organic layer, and the second buffer inorganic layer may further include a shape corresponding to a wrinkle shape of the second buffer organic layer.

According to one or more exemplary embodiments, the forming the first organic film layer may further include forming the first organic film layer including hexamethyldisiloxane acid according to a CVD method using a first ratio of $N_2O$ in an entire gas, and the forming the second buffer organic layer may further include forming the second buffer organic layer including hexamethyldisiloxane acid according to the CVD method using a second ratio of $N_2O$, which is different from the first ratio, in the entire gas.

According to one or more exemplary embodiments, the forming the second buffer organic layer may include forming the second buffer organic layer using acrylate.

According to one or more exemplary embodiments, the forming the first organic film layer may include disposing an acrylate layer and hardening the acrylate layer using ultraviolet light of a first brightness, and the forming the second buffer organic layer may include disposing an acrylate layer and hardening the acrylate layer using ultraviolet of a second brightness lower than the first brightness.

According to one or more exemplary embodiments, the forming the first organic film layer may include disposing an acrylate layer and irradiating ultraviolet light on the acrylate layer for a first time period, and the forming the second buffer organic layer may include disposing an acrylate layer and irradiating ultraviolet light on the acrylate layer for a second time period shorter than the first time period.

According to one or more exemplary embodiments, the method may further include forming an inorganic film over the first organic layer, the inorganic film including a flattened upper surface.

BRIEF DESCRIPTION OF THE DRAWINGS

These and/or other exemplary embodiments will become apparent and more readily appreciated from the following description of the exemplary embodiments, taken in conjunction with the accompanying drawings in which:

FIGS. 8A and 8B are cross-sectional views schematically illustrating another exemplary embodiment of operations of a method of manufacturing a display apparatus;

DETAILED DESCRIPTION

Figure 1:
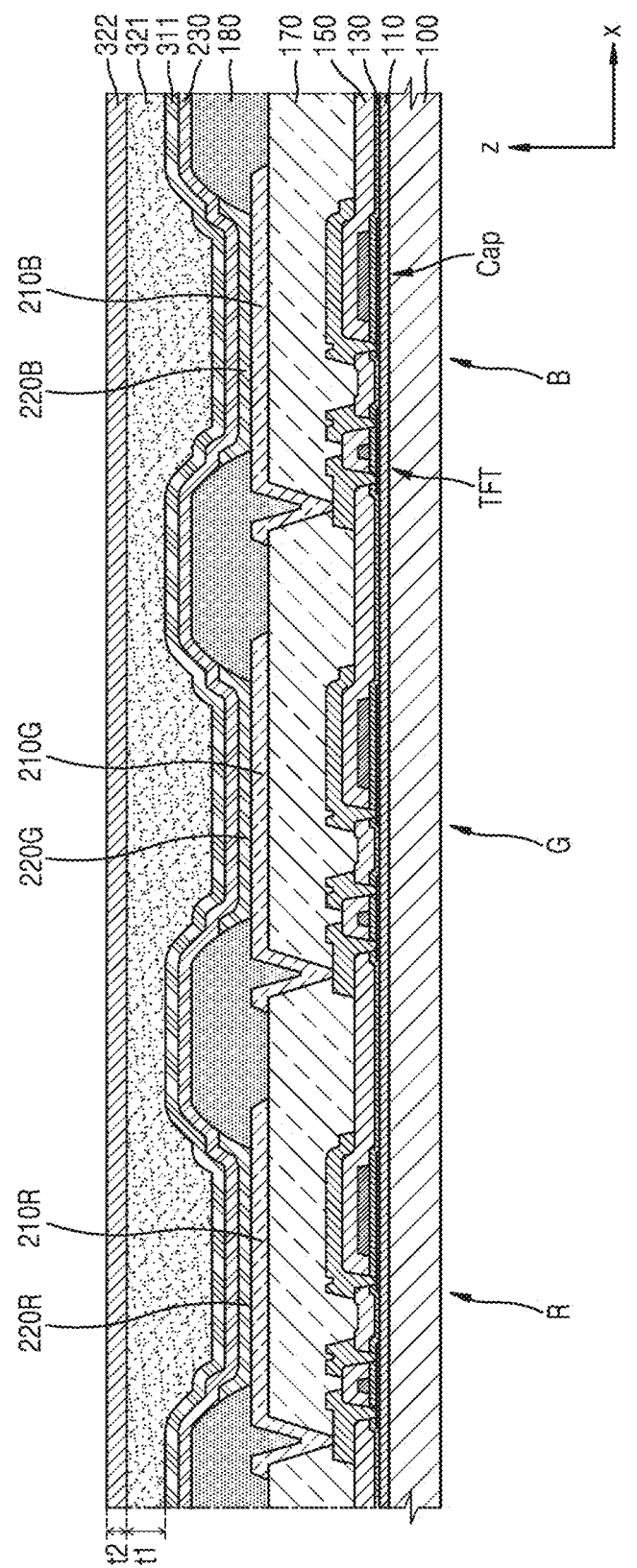
FIGS. 1 through 3 are cross-sectional views illustrating an exemplary embodiment of operations of a method of manufacturing a display apparatus.

The exemplary embodiments may have different forms and should not be construed as being limited to the descriptions set forth herein. Accordingly, the exemplary embodiments are merely described below, by referring to the figures, to explain exemplary embodiments of the description.

Reference will now be made in detail to exemplary embodiments, examples of which are illustrated in the accompanying drawings, in which like reference numerals refer to like elements throughout.

It will be understood that when a layer, film, region, or component is referred to as being "disposed on," another layer, film, region, or component, it can be directly or indirectly disposed on the other layer, film, region, or component. That is, for example, intervening layers, films, regions, or components may be present. Sizes of elements in the drawings may be exaggerated for convenience of explanation. In other words, since sizes and thicknesses of components in the drawings are arbitrarily illustrated for convenience of explanation, the following embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

As used herein, the term "and/or" includes any and all combinations of one or more of the associated listed items. Expressions such as "at least one of," when preceding a list of elements, modify the entire list of elements and do not modify the individual elements of the list.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an exemplary embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an exemplary embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Figure 2:
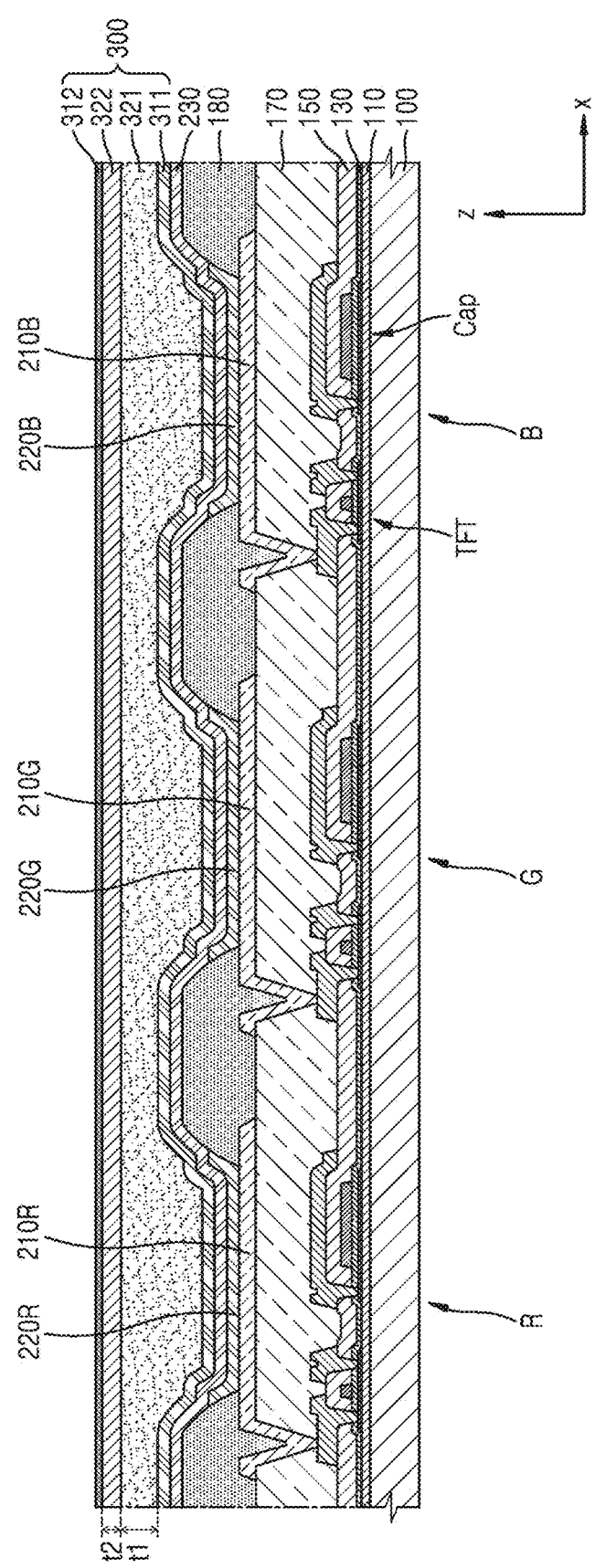
Figure 3:
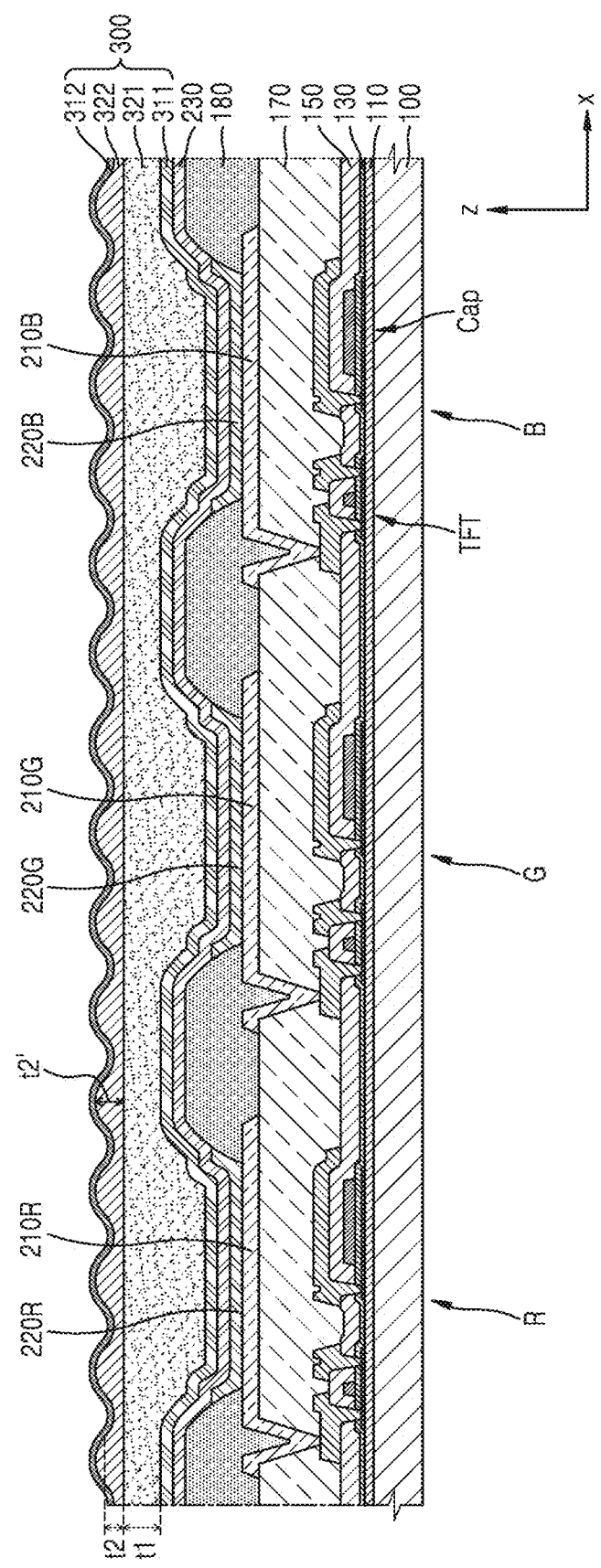

FIGS. 1 through 3 are cross-sectional views illustrating operations of a method of manufacturing a display apparatus, according to one exemplary embodiment of the invention. In detail, FIGS. 1 through 3 are cross-sectional views illustrating the operations of the method of manufacturing an organic light-emitting display apparatus having an organic emission device as a display element. However, the invention is not limited to the manufacturing method of the organic light-emitting display apparatus. It is possible that the manufacturing method may be applied to manufacture a display apparatus having other types of display elements.

Referring to FIG. 1, a back plane is provided. Here, the back plane may include at least a substrate 100, a plurality of first electrodes 210R, 210G, and 210B, and a pixel defining film 180 which exposes at least a portion of a center portion of the respective first electrodes 210R, 210G, and 210B. The pixel defining film 180 may protrude from the plurality of first electrodes 210R, 210G, and 210B in a +z direction with respect to the substrate 100.

In an exemplary embodiment, the substrate 100 may include at least one of various materials, for example, glass, a metal, and plastic, such as polyethylene terephthalate ("PET"), polyethylene naphthalate ("PEN"), and polyimide.

The plurality of first electrodes 210R, 210G, and 210B may be pixel electrodes. Among the pixel electrodes, the first electrode 210R may be referred to as a first pixel electrode, the first electrode 210G may be referred as a second pixel electrode, and the first electrode 210B may be referred to as a third pixel electrode, since intermediate layers which are disposed on the respective first through third pixel electrodes are different from one another. For convenience, the first electrodes including the first through third pixel electrodes may be referred to as a pixel electrode 210R, a pixel electrode 210G, and a pixel electrode 210B, hereinafter.

In an exemplary embodiment, the pixel electrodes 210R, 210G, and 210B may be a transparent (or semitransparent) electrode or a reflective electrode. In an exemplary embodiment, when the pixel electrodes 210R, 210G, and 210B are the transparent (or semitransparent) electrode, the pixel electrodes 210R, 210G, and 210B may include indium tin oxide ("ITO"), indium zinc oxide ("IZO"), zinc oxide (ZnO), indium oxide ($In_2O_3$), indium gallium oxide ("IGO"), or aluminum zinc oxide ("AZO"). When the pixel electrodes 210R, 210G, and 210B are the reflective electrode, the pixel electrodes 210R, 210G, and 210B may include a reflective film including silver (Ag), magnesium (Mg), aluminum (Al), platinum (Pt), palladium (Pd), gold (Au), nickel (Ni), neodymium (Nd), iridium (Ir), chrome (Cr), or any combinations thereof, and a film including ITO, IZO, zinc oxide (ZnO), or indium oxide (In2O3). However, the invention is not limited thereto. A structure and material of the pixel electrodes 210R, 210G, and 210B may be modified.

The pixel electrodes 210R, 210G, and 210B may be disposed in a display area of the substrate 100. In an exemplary embodiment, the pixel electrodes 210R, 210G, and 210B may be respectively disposed in a region representing a red color R, a region representing a green color G, and a region representing a blue color B.

An opening may be defined in the pixel defining film 180 to expose an entire portion or a portion of a center region of the corresponding pixel electrode 210R, 210G, or 210B to outside so that a pixel is defined. Also, the pixel defining film 180 may prevent generation of arc from an end of the corresponding pixel electrodes 210R, 210G, or 210B by increasing a distance between the end of the corresponding pixel electrode 210R, 210G, or 210B and an opposite electrode (not illustrated) which is disposed opposite to the corresponding pixel electrode 210R, 210G, or 210B.

The back plane may further include various structural elements when necessary. In an exemplary embodiment, a thin film transistor TFT or a capacitor Cap may be disposed on the substrate 100 as illustrated in FIG. 1, for example. The back plane may further include a buffer layer 110 provided to prevent a permeation of impurities into a semiconductor layer of the thin film transistor TFT, a gate insulation film 130 provided to insulate a gate electrode from the semiconductor layer of the thin film transistor TFT, an interlayer insulation layer 150 provided to insulate the gate electrode from source/drain electrodes of the thin film transistor TFT, and a planarization film 170 having a top flat surface and covering the thin film transistor TFT.

After the back plane is prepared as described above, intermediate layers 220R, 220G, and 220B are disposed on the corresponding pixel electrodes 210R, 210G, and 210B as illustrated in FIG. 1. The intermediate layers 220R, 220G, and 220B may include a multilayer including a light-emitting layer. In this case, the intermediate layers 220R, 220G, and 220B may be a common layer corresponding to the entire substrate 100 or patterned layers corresponding to the respective pixel electrodes 210R, 210G, and 210B. The intermediate layers 220R, 220G, and 220B may include a low molecule material or a polymer and may include a hole injection layer, a hole transport layer, a light-emitting layer, an electron transport layer, or an electron injection layer. In an exemplary embodiment, the intermediate layers 220R, 220G, and 220B may be provided according to various methods, such as a deposition method, a spin-coating method, an ink-jet printing method, and/or a laser thermal transfer method.

After the intermediate layers 220R, 220G, and 220B are provided, an opposite electrode 230 is disposed on the corresponding intermediate layers 220R, 220G, and 220B. The opposite electrode 230 may be a transparent (or semitransparent) electrode or a reflective layer. In an exemplary embodiment, when the opposite electrode 230 is the transparent (or semitransparent) electrode, the opposite electrode 230 may include a layer having a metal having a low work function, such as lithium (Li), calcium (Ca), lithium fluoride (LiF/Ca), LiF/Al, aluminum (Al), silver (Ag), magnesium (Mg), or any combinations thereof, and a transparent (or semitransparent) layer such as ITO, IZO, zinc oxide (ZnO), or indium oxide ($In_2O_3$). When the opposite electrode 230 is the reflective electrode, the opposite electrode 230 may include lithium (Li), calcium (Ca), lithium fluoride/calcium (LiF/Ca), lithium fluoride/aluminum (LiF/A1), aluminum (Al), silver (Ag), magnesium (Mg) or any combinations thereof. However, the invention is not limited thereto. A structure and material of the opposite electrode 230 may be modified.

After the opposite electrode 230 is provided, an encapsulation film is provided to prevent a permeation of external oxygen or moisture into display elements including the pixel electrodes 210R, 210G, and 210B, the intermediate layers 220R, 220G, and 220B, and the opposite electrode 230.

As illustrated in FIG. 1, a first inorganic film layer 311 is disposed on the opposite electrode 230 and covers the display elements. The first inorganic film layer 311 may include silicon nitride, silicon oxide, and/or silicon oxide nitride, or may include metal oxide, metal nitride, metal oxide nitride, or metal carbide. The first inorganic film layer 311 may be provided according to a chemical vapor deposition ("CVD") method, for example. The first inorganic film layer 311 may have a uniform thickness and may also have a curve along a curve of the opposite electrode 230, which corresponds to a curve of the pixel defining film 180 and is disposed below the first inorganic film layer 311.

A first organic film layer 321 is disposed on the first inorganic film layer 311. The first organic film layer 321 may planarize a curved shape of the first inorganic film layer 311. Accordingly, the first organic film layer 321 may have a flat upper surface. Also, even when a crack occurs in the first inorganic film layer 311, the crack may not be extended to a second organic film layer 322, which is disposed on the first organic film layer 321, since the first organic film layer 321 covers the first inorganic film layer 311. In an exemplary embodiment, the first organic film layer 321 may include at least one of polyacrylate, polyethylene terephthalate, polyethylene naphthalate, polycarbonate, polyimide, polyethylene sulfonate, polyoxymethylene, polyarylate, and hexamethyldisiloxane, for example.

The second organic film layer 322 is disposed on the first organic film layer 321 as illustrated in FIG. 1. Here, the second organic film layer 322 may have a hardness lower than a hardness of the first organic film layer 321. In an exemplary embodiment, the second organic film layer 322 may be provided using the hexamethyldisiloxane according to the CVD method, for example. When an organic film layer having the hexamethyldisiloxane is provided according to the CVD method, the organic film layer is provided by combining the hexamethyldisiloxane, nitrogen monoxide, and helium gas. In this case, the hardness of the organic film layer may be adjusted by controlling a ratio of the nitrogen monoxide in an entire gas.

In an exemplary embodiment, even when the first organic film layer 321 and the second organic film layer 322 are provided using the same combination of gas including the hexamethyldisiloxane, the hardness of the first organic film layer 321 becomes different from the hardness of the second organic film layer 322 when the first organic film layer 321 is provided using the nitrogen monoxide having a first ratio of the entire gas according to the CVD method and when the second organic film layer 322 is provided using the nitrogen monoxide having a second ratio of the entire gas, which is different from the first ratio according to the CVD method, for example. In an exemplary embodiment, when the ratio of the nitrogen monoxide increases, the hardness of the organic film layer also increases, for example.

The hardness of the second organic film layer 322 may be different from the hardness of the first organic film layer 321 even when the first organic film layer 321 and the second organic film layer 322 are provided using different materials. A material which is used to form the second organic film layer 322 may not be limited to the hexamethyldisiloxane.

In an exemplary embodiment, the second organic film layer 322 may be provided using acrylate, for example. In this case, the hardness of the second organic film layer 322 may become lower than the hardness of the first organic film layer 321 by adjusting an amount of the hardness after the acrylate is disposed on the first organic film layer 321 according to a printing method or a coating method. In detail, when an acrylate layer is prepared and then hardened by irradiating the acrylate layer with ultraviolet light, the acrylate layer may have a lower hardness when illumination of the ultraviolet light is lowered. Accordingly, the acrylate layer is provided, the acrylate layer is hardened by irradiating the acrylate layer with a first illumination of the ultraviolet light to form the first organic film layer 321, and another acrylate layer is prepared and then hardened by irradiating the other acrylate layer with a second illumination of the ultraviolet light, which is lower than the first illumination of the ultraviolet, such that the second organic film layer 322 has the hardness lower than the hardness of the first organic film layer 321.

Moreover, the hardness of the organic film layer may be controlled by controlling a time period during which the ultraviolet light is irradiated on the acrylate layer to harden the acrylate layer. That is, the acrylate layer is prepared and then irradiated with the ultraviolet light for a first time period to form the first organic film layer 321. Another acrylate layer is prepared and then irradiated with the ultraviolet light for a second time period, which is shorter than the first time period, to form the second organic film layer 322. It is possible to form the second organic film layer 322 having the hardness which is lower than the hardness of the first organic film layer 321.

As such, after the first organic film layer 321 and the second organic film layer 322 are provided, a second inorganic film layer 312 is disposed on the second organic film layer 322 as illustrated in FIG. 2. In an exemplary embodiment, the second inorganic film layer 312 may include silicon nitride, silicon oxide, and/or silicon oxide nitride, or may include metal oxide, metal nitride, metal oxide nitride, or metal carbide, for example. In an exemplary embodiment, the second inorganic film layer 312 may be provided according to the CVD method, for example.

Here, the second inorganic film layer 312 may have a residual stress. When the second inorganic film layer 312 is disposed on a layer having a high hardness, the second inorganic film layer 312 may not be changed. However, since the second inorganic film layer 312 is disposed on the second organic film layer 322 having a small hardness as illustrated in the method of manufacturing the display apparatus according to the exemplary embodiment, an upper surface of the second organic film layer 322 may be provided with wrinkles having a uniform interval due to the residual stress of the second inorganic film layer 312, as illustrated in FIG. 3. The second inorganic film layer 312 may have a curve provided along the wrinkles of the upper surface of the second organic film layer 322. The wrinkles are not only provided on the upper surface of the second organic film layer 322 as illustrated in FIG. 3 after the second inorganic film layer 312 is provided as illustrated in FIG. 2, but also provided on the upper surface of the second organic film layer 322 during formation of the second inorganic film layer 312 and then the curve of the second inorganic film layer 312 may be provided along the wrinkles of the upper surface of the second organic film layer 322.

According to the display apparatus manufactured by the exemplary embodiment, an encapsulation film 300 may include the first inorganic film layer 311, the first organic film layer 321, the second organic film layer 322, and the second inorganic film layer 312. The wrinkles are provided on the upper surface of the second organic film layer 322, and the second inorganic film layer 312 is provided along the wrinkles of the second organic film layer 322 such that a high performance flexible display apparatus may be realized.

A conventional display apparatus manufactured by a conventional manufacturing method has a problem that a flexibility of the conventional display apparatus is degraded. That is, although a substrate or a display element has a flexibility, a flexibility of the entire conventional display apparatus is degraded due to a low flexibility of an encapsulation film. When the entire second inorganic film layer 312 has the uniform thickness but has a flat shape as illustrated in FIG. 2, for example, cracks are easily generated on the second inorganic film layer 312 when a center of the conventional display apparatus is bent convexly to protrude in the +z direction and when both ends of the conventional display apparatus in the +x and −x directions are bent in a −z direction, for example.

However, in the display apparatus manufactured by the manufacturing method according to the exemplary embodiment, the entire second inorganic film layer 312 has a uniform thickness and also has a shape to correspond to a wrinkle shape of the upper surface of the second organic film layer 322. Accordingly, even when the center region of the display apparatus is bent convexly to protrude in the +z direction and when the both ends of the display apparatus in the +x and −x directions are bent in the −z direction, generation of the cracks are effectively prevented from the second inorganic film layer 312 since the wrinkle shape of the second inorganic film layer 312 are effectively straightened. Also, since the first organic film layer 321 and the second organic film layer 322*a* have the excellent flexible characteristics as an organic film layer, the cracks are not generated even when the display apparatus is bent.

In order to manufacture the display apparatus having a shape illustrated in FIG. 3, it may be possible to form the wrinkle shape on the upper surface of the second organic film layer 322 when the second organic film layer 322 is provided, and then to form the second inorganic film layer 312 on the wrinkled second organic film layer 322. Accordingly, a manufacturing process becomes complicated and a manufacturing cost increases when the wrinkles are provided according to additional processes when the second organic film layer 322 is provided.

However, the method of manufacturing the display apparatus according to the exemplary embodiment controls a process condition during formation of the second organic film layer 322, but does not require the additional processes to form the wrinkles on the upper surface of the second organic film layer 322. Accordingly, the manufacturing process is simplified, the manufacturing cost is significantly reduced, and a defect ratio of the manufactured display apparatuses is also decreased. Also, since the method of manufacturing the display apparatus according to the exemplary embodiment may form all the first inorganic film layer 311, the first organic film layer 321, the second organic film layer 322, and the second inorganic film layer 312 using the CVD method, a moving distance to move the substrate 100 during the manufacturing process is significantly reduced and thus the manufacturing process becomes simplified.

Figure 4:
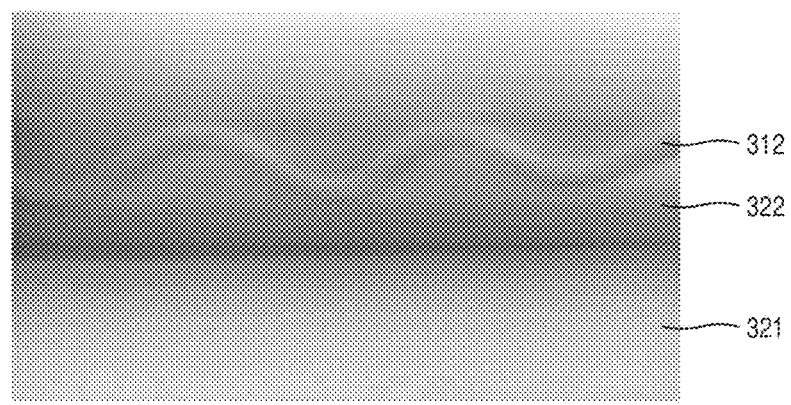
FIG. 4 is a cross-sectional image illustrating an exemplary embodiment of a portion of a display apparatus.

FIG. 4 is a cross-sectional picture view illustrating a portion of a display apparatus manufactured by the above-described method according to one exemplary embodiment of the invention. FIG. 4 illustrates the second organic film layer 322 disposed on a flat upper surface of the first organic film layer 321, wrinkles provided on an upper surface of the second organic film layer 322, and the second inorganic film layer 312 having a shape corresponding to the wrinkles of the second organic film layer 322. In another exemplary embodiment, all of the first organic film layer 321 and the second organic film layer 322 include the hexamethyldisiloxane, for example.

Intervals of the wrinkles of the upper surface of the second organic film layer 322 are shortened when the hardness of the second organic film layer 322 is lower than the first organic film layer 321. According to this experiment, when a thickness of the second organic film layer 322 was less, the interval of the wrinkles of the upper surface of the second organic film layer 322 became shortened. Accordingly, as illustrated in FIG. 1, a thickness t2 of the second organic film layer 322 may be less than a minimum thickness t1 of the first organic film layer 321 when the second organic film layer 322 is provided. According to the manufacturing method as illustrated in FIG. 3, a maximum thickness t2' of the second organic film layer 322 may be less than the minimum thickness t1 of the first organic film layer 321.

Figure 5:
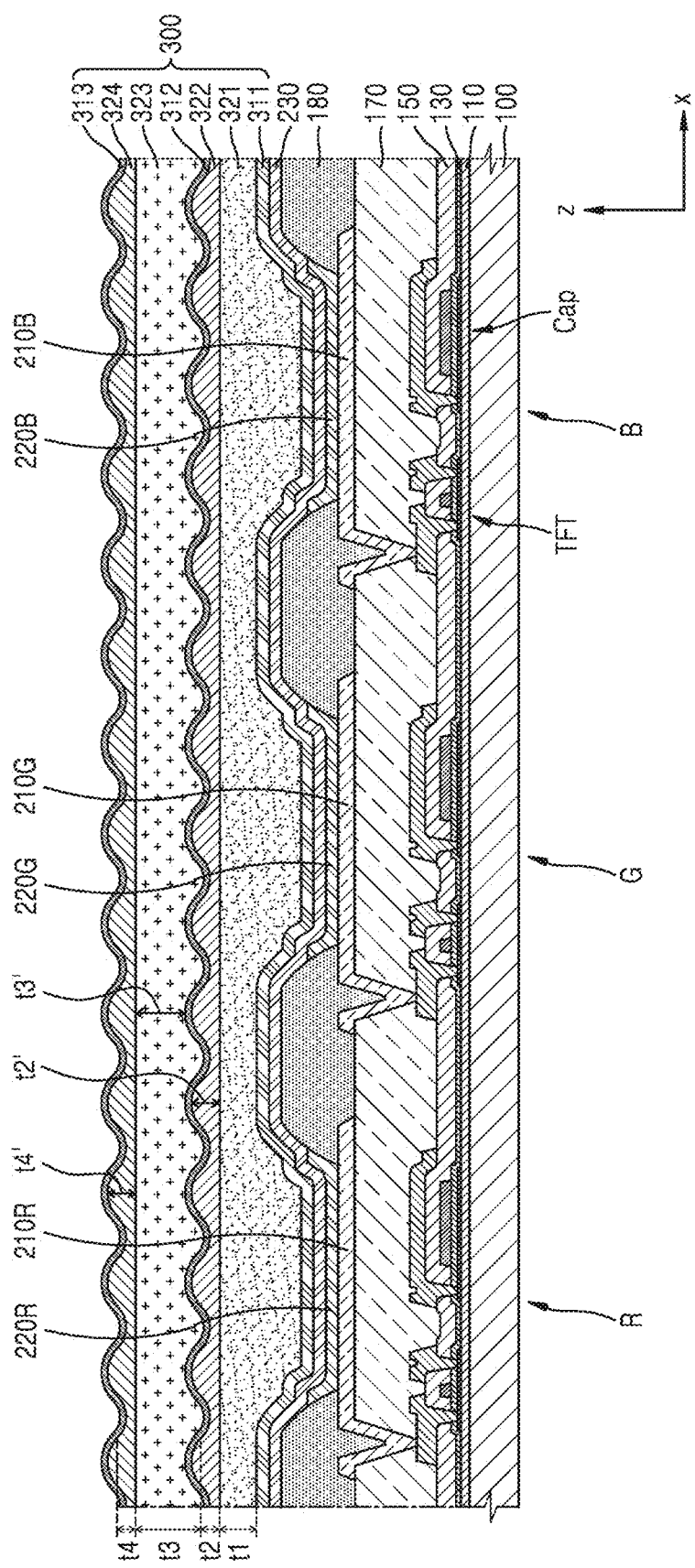
FIG. 5 is a cross-sectional view illustrating another exemplary embodiment of a portion of a display apparatus.

A third organic film layer 323, a fourth organic film layer 324, and a third inorganic film layer 313 may be further provided above the second inorganic film layer 312 as illustrated in FIG. 5, in addition to the first inorganic film layer 311, the first organic film layer 321, the second organic film layer 322, and the second inorganic film layer 311. That is, after the second inorganic film layer 312 having the wrinkles is provided, the third organic film layer 323 is disposed on the second inorganic film layer 312, planarizes the second inorganic film layer 312, and has a flat upper surface. And then, a fourth organic film layer 324 is disposed on the flat upper surface of the third organic film layer 323 and has a thickness t4 less than a thickness t3 of the third organic film layer 323. When a third inorganic film layer 313 is disposed on the fourth organic film layer 324, wrinkles are provided on an upper surface of the fourth organic film layer 324 due to a residual stress of the third inorganic film layer 313. Accordingly, the third inorganic film layer 313 may have a curve shape corresponding to the wrinkles of the upper surface of the fourth organic film layer 324.

In this process, a forming process and a material of the third organic film layer 323 are the same as a forming process and a material of the first organic film layer 321, a forming process and a material of the fourth organic film layer 324 are the same as a forming process and a material of the second organic film layer 322, and a forming process and a material of the third inorganic film layer 313 are the same as a forming process and a material of the second inorganic film layer 312. When the display apparatus is manufactured using the above-described method, a maximum thickness t4' of the fourth organic film layer 324 may be less than a minimum thickness t3' of the third organic film layer 323 as illustrated in FIG. 5. The minimum thickness t3' of the third organic film layer 323 may be greater than a maximum thickness t2' of the second organic film layer 322 which is disposed below the third organic film layer 323.

Although the method includes forming the first organic film layer 321, forming the second organic film layer 322 on the first organic film layer 321, and then forming the second inorganic film layer 312 on the second organic film layer 322 so that the wrinkles are provided on the upper surface of the second organic film layer 322, the invention is not limited thereto. It is possible to omit the forming the first organic film layer 321.

In an exemplary embodiment, without forming the first organic film layer 321, the second organic film layer 322 having a small hardness may be disposed on the first inorganic film layer 311 so that the wrinkles are provided on the upper surface of the second organic film layer 322, for example. In this case, a single organic layer which is a combination of the first organic film layer 321 and the second organic film layer 322, which are illustrated in FIGS. 1 and 2, may be referred to as the second organic film layer 322. Moreover, without the forming third organic film layer 323 of FIG. 5, the fourth organic film layer 324 having a small hardness may be disposed on the second inorganic film layer 312, and thereafter the third inorganic film layer 313 is disposed on the fourth organic film layer 324 so that the wrinkles are provided on the upper surface of the fourth organic film layer 324. In this case, a single organic layer which is a combination of the third organic film layer 323 and the fourth organic film layer 324, which are illustrated in FIG. 5, may be referred to as the fourth organic film layer 324.

Although the method of manufacturing the display apparatus is described above, the invention is not limited thereto. A display apparatus which is manufactured by the above-described method is also within the scope of the invention.

The display apparatus which is manufactured by the above-described method may have a structure as illustrated in FIG. 3. That is, the display apparatus may include the substrate 100, display elements arranged on the substrate 100, and the encapsulation film 300 to cover the display elements.

The encapsulation film 300 may include the first inorganic film layer 311, the first organic film layer 321 disposed on the first inorganic film layer 311 and having a flat upper surface, the second organic film layer 322 disposed on the first organic film layer 321 and having the wrinkled upper surface, and the second inorganic film layer 312 disposed on the second organic film layer 322 and having a shape corresponding to the wrinkled upper surface of the second organic film layer 322.

In the display apparatus according to the exemplary embodiment, the entire second inorganic film layer 312 may have the uniform thickness and also have the shape corresponding to the wrinkle shape of the wrinkled upper surface of the second organic film layer 322. When the center region of the display apparatus is bent convexly in the +z direction and the both ends of the display apparatus respectively disposed in the +x and −x directions are bent in the −z direction, the wrinkle shape of the second inorganic film layer 312 is spread so that generation of the cracks are effectively prevented from the second inorganic film layer 312. The cracks may not occur in the first organic film layer 321 and the second organic film layer 322 due to the flexible characteristic of an organic film layer even when the organic film layer is bent.

The forming processes and materials of the first inorganic film layer 311, the first organic film layer 321, the second organic film layer 322, and the second inorganic film layer 312 are the same as described above. In an exemplary embodiment, the second organic film layer 322 may include hexamethyldisiloxane or polyacrylate, for example. The hardness of the first inorganic film layer 311 may be greater than the hardness of the second organic film layer 322. In the manufacturing process, a maximum thickness t2' of the second organic film layer 322 is less than a minimum thickness t1 of the first inorganic film layer 311 so that the intervals of the wrinkles of the upper surface of the second organic film layer 322 are shortened.

The invention is not limited to the display apparatus which is described above. The display apparatus further including the third organic film layer 323, the fourth organic film layer 324, and the third inorganic film layer 313, which are disposed above the second inorganic film layer 312 as illustrated in FIG. 5, is also within the scope of the invention. That is, in the display apparatus according to the exemplary embodiment, the third organic film layer 323 is disposed on the wrinkled upper surface of the second inorganic film layer 312 for planarization and having the flat upper surface, the fourth organic film layer 324 is disposed on the third organic film layer 323 and includes the wrinkled upper surface having the thickness t4 less than the thickness t3 of the third organic film layer 323, and the third inorganic film layer 313 is disposed on the fourth organic film layer 324 and includes a curve provided along the wrinkled upper surface of the fourth organic film layer 324.

Although the second organic film layer 322 disposed on the first organic film layer 321 and having the wrinkled upper surface is described above, the invention is not limited thereto. That is, in another exemplary embodiment, the first organic film layer 321 may be omitted. In this case, a single organic layer, which is provided by combining the first organic film layer 321 and the second organic film layer 322 which are illustrated in FIG. 2, may be referred to as the second organic film layer 322. Also, in another exemplary embodiment, the third organic film layer 323 of FIG. 5 may be omitted. In this case, a single organic layer, which is provided by combining the third organic film layer 323 and the fourth organic film layer 324 which are illustrated in FIG. 5, may be referred to as the fourth organic film layer 324. A method of manufacturing an organic light-emitting display having the above-described structure is the same as described above.

Figure 6A:
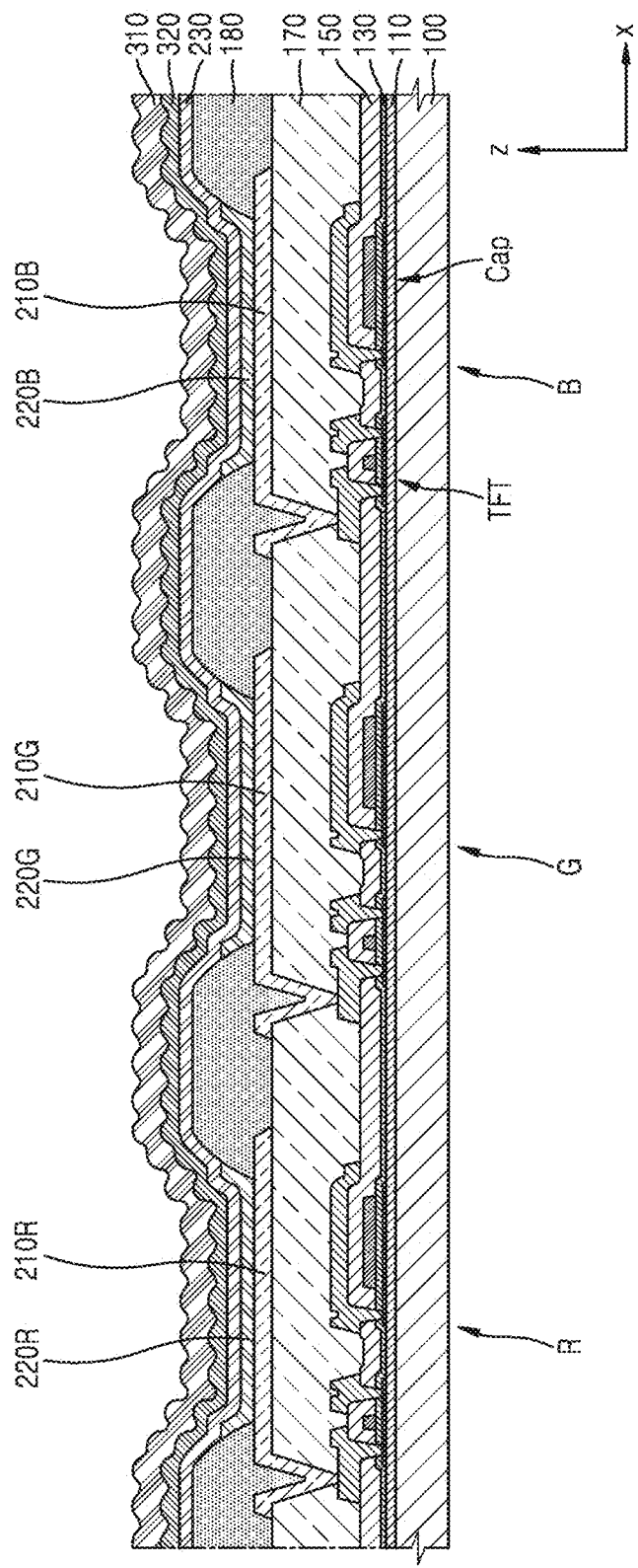
FIGS. 6A and 6B are cross-sectional views schematically illustrating an exemplary embodiment of operations of a method of manufacturing a display apparatus.
Figure 6B:
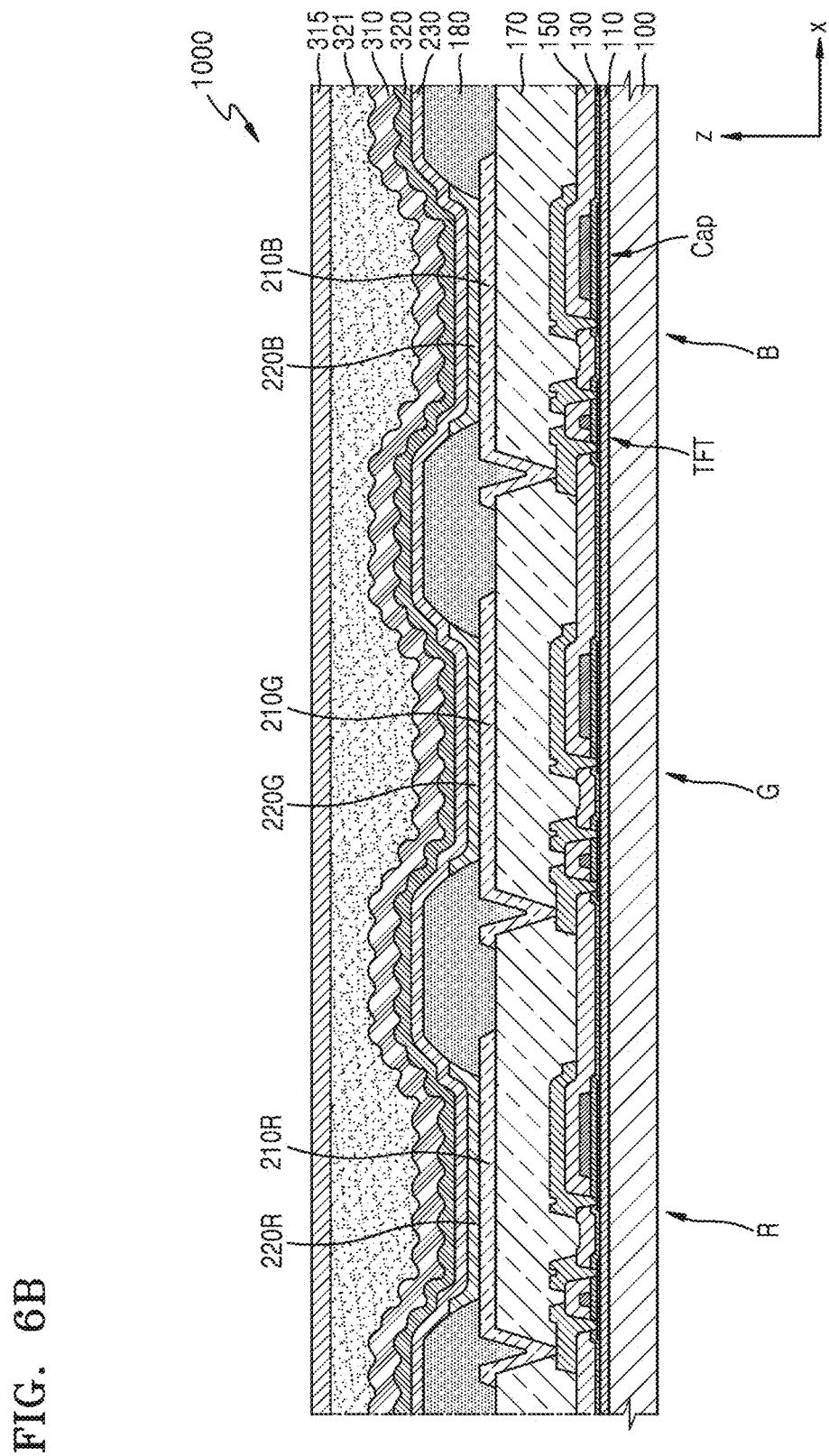

FIGS. 6A and 6B are cross-sectional views schematically illustrating operations of a method of manufacturing a display apparatus 1000, according to an exemplary embodiment. The same references of FIGS. 6A and 6B as FIGS. 1 through 5 respectively represent the same elements. Here, duplicate descriptions thereof will be omitted for brief description.

A back plane is prepared as illustrated in FIG. 6A. Here, the back plane may include at least a substrate 100, a plurality of pixel electrodes, which may be referred to as first electrodes or first pixel electrodes, 210R, 210G, and 210B disposed over the substrate 100, and a pixel defining film 180 exposing at least portions the plurality of pixel electrodes 210R, 210G, and 210B including at least center portions of the plurality of pixel electrodes 210B, 210G, and 210B.

After the back plane is prepared, as illustrated in FIG. 6A, intermediate layers 220R, 220G, and 220B are provided over the back plane, and opposite electrodes 230 are provided over the respective intermediate layers 220R, 220G, and 220B.

After the opposite electrodes 230 are provided, an encapsulating film is provided to prevent a permeation of foreign oxygen and moisture into a display element including the plurality of pixel electrodes 210R, 210G, and 210B, the intermediate layers 220R, 220G, and 220B, and the opposite electrodes 230.

As illustrated in FIG. 6A, a first buffer organic layer 320 may be provided over the opposite electrodes 230 and may cover the display element. In an exemplary embodiment, the first buffer organic layer 320 may include one or more materials including polyacrylate, polyethylene terephthalate, polyethylene naphthalate, polycarbonate, polyimide, polyethylene sulfonate, polyoxymethylene, polyarylate, and hexamethyl silock acid, for example.

Since the first buffer organic layer 320 includes an organic material, the first buffer organic layer 320 may have a material characteristic, such as a flexible characteristic, and may maintain a fluidity by adjusting a process condition of a manufacturing process of forming the first buffer organic layer 320.

According to an exemplary embodiment, the first buffer organic layer 320 may be provided according to a CVD method using hexamethyldisiloxane acid, for example. When an organic layer including the hexamethyldisiloxane acid is provided according to the CVD method, an organic film may be provided by combining the hexamethyldisiloxane acid, nitrogen monoxide, and helium gas. Here, a hardness of the organic layer may be controlled by adjusting a ratio of the nitrogen monoxide with respect to the entire gas.

In an exemplary embodiment, even when the organic layer is provided using the entire gas having the same compounds and including the hexamethyldisiloxane acid, the first buffer organic layer 320 may have a lower hardness than a generally-provided organic layer when the first buffer organic layer 320 is provided according to the CVD method at a lower ratio of the nitrogen monoxide among the entire gas, for example. According to an exemplary embodiment, the first buffer organic layer 320 may have the lower hardness than a first organic film layer 321 (refer to FIG. 6B), which will be described later.

However, a material used to form the first buffer organic layer 320 may not be limited to the hexamethyldisiloxane acid.

In an exemplary embodiment, the first buffer organic layer 320 may be provided using acrylate, for example. In this case, the first buffer organic layer 320 having the lower hardness may be provided when the first buffer organic layer 320 is provided using the acrylate according to a printing method or a coating method and by adjusting an amount of hardening the acrylate. In detail, when an acrylate layer is hardened, ultraviolet light is irradiated on the acrylate layer to harden the acrylate layer. Here, a brightness of the irradiated ultraviolet light is low, the acrylate layer having a lower hardness is provided. Accordingly, the first buffer organic layer 320 may be provided by disposing the acrylate layer and hardening the acrylate using the ultraviolet light having a lower brightness than a brightness of the ultraviolet to form the generally-provided organic layer. According to an exemplary embodiment, the first buffer organic layer 320 may be provided by hardening using the ultraviolet having the lower brightness than the brightness of the ultraviolet to form the first organic film layer 321 (refer to FIG. 6B).

Moreover, when the acrylate layer is hardened, a time period of irradiating the ultraviolet light on the acrylate layer may be controlled to adjust the hardness of the organic film layer. That is, when the first buffer organic layer 320 is provided by disposing the acrylate layer and hardening the acrylate layer by irradiating the ultraviolet light on the acrylate layer for a shorter time period than a time period to form a generally-provided organic layer, the first buffer organic layer 320 may have the lower hardness. According to an exemplary embodiment, the first buffer organic layer 320 may be provided by irradiating the ultraviolet light on the acrylate layer for a shorter time period to harden the acrylate layer than a time period to form the first organic film layer 321 (refer to FIG. 6B).

As described above, after the first buffer organic layer 320 is provided, a first buffer inorganic layer 310 may be provided over the first buffer organic layer 320, as illustrated in FIG. 6A.

In an exemplary embodiment, the first buffer inorganic layer 310 may include silicon nitride, silicon oxide, and/or silicon oxynitride, or may include metal oxide, metal nitride, metal oxynitride, or metal carbon, for example. The first buffer inorganic layer 310 may be provided by the CVD method and may have a uniform thickness.

Here, the first buffer inorganic layer 310 may have a residual stress, and the first buffer inorganic layer 310 may be rarely changed when the first buffer inorganic layer 310 is provided over a layer having a higher hardness. However, in a method of manufacturing a display apparatus according to the exemplary embodiment, when the first buffer inorganic layer 310 is provided over the first buffer organic layer 320 having the lower hardness, wrinkles having a uniform period may be provided on an upper surface of the first buffer organic layer 320 according to the residual stress, which remains in the first buffer inorganic layer 310, as illustrated in FIG. 6A, and the first buffer inorganic layer 310 may be curved according to the wrinkles of the upper surface of the first buffer organic layer 320.

The wrinkles may not be provided on the upper surface of the first buffer organic layer 320 only after the first buffer inorganic layer 310 is provided. That is, the formation of the curved surface of the first buffer organic layer 320 may be completed during forming the first buffer inorganic layer 310, depending on a manufacturing process.

Next, a first organic film layer 321 may be provided to cover the first buffer inorganic layer 310, as illustrated in FIG. 6B.

The first organic film layer 321 may flatten a curved shape of the first buffer inorganic layer 310.

That is, although the first buffer inorganic layer 310 is curved along the wrinkles of the upper surface of the first buffer organic layer 320, the first organic film layer 321 may have a flattened upper surface.

Moreover, since the first organic film layer 321 covers the first buffer inorganic layer 310, cracks may not be extended to the first buffer inorganic layer 310, which is provided below the first organic film layer 321, even when the cracks occur in a fifth inorganic film layer 315 which will be described later.

In an exemplary embodiment, the first organic film layer 321 may include one or more materials including polyacrylate, polyethylene terephthalate, polyethylene naphthalate, polycarbonate, polyimide, polyethylene sulfonate, polyoxymethylene, polyarylate, and hexamethyl silock acid, for example.

The fifth inorganic film layer 315 may be provided over the first organic film layer 321 as illustrated in FIG. 6B.

In an exemplary embodiment, the fifth inorganic film layer 315 may include silicon nitride, silicon oxide, and/or silicon oxynitride, and may include metal oxide, metal nitride, metal oxynitride or metal carbon, for example. In an exemplary embodiment, the fifth inorganic film layer 315 may be provided according to a CVD method, for example. Since the flattened upper surface of the first organic film layer 321 is disposed below the fifth inorganic film layer 315, the fifth inorganic film layer 315 may also have a flattened upper surface to correspond to the flattened upper surface of the first organic film layer 321 and may have a uniform thickness.

As described above, when a display apparatus 1000 is manufactured according to the exemplary embodiment, the encapsulating layer may include the first buffer organic layer 320, the first inorganic layer 310, the first organic film layer 321, and the fifth inorganic film layer 315. The wrinkles are provided on the upper surface of the first buffer organic layer 320, and the first buffer inorganic layer 310 may be provided along the wrinkles of the upper surface of the first buffer organic layer 320. Accordingly, the display apparatus 1000 may be realized as a flexible display apparatus having excellent characteristics.

A display apparatus manufactured according to a conventional manufacturing method has a problem that a flexible characteristic is degraded. That is, even when a substrate or a display element has the flexible characteristic, the display apparatus has a problem that an entire flexible characteristic of the display apparatus becomes lowered due to a low flexible characteristic of an encapsulating film. In an exemplary embodiment, when the first buffer inorganic layer 310 has a uniform thickness but does not have a flattened shape differently from FIG. 6B, cracks easily occur in the first buffer inorganic layer 310 when a center portion of a display apparatus is curved and convex in a +z direction, and boundary portions of the display apparatus in a +x direction and a −x direction are bent in a −z direction, for example.

However, in the display apparatus manufactured by a method of manufacturing the same according to the exemplary embodiment, the entire first buffer inorganic layer 310 has a uniform thickness and has a shape corresponding to the wrinkles of the upper surface of the first buffer organic layer 320, as illustrated in FIG. 6B. Accordingly, when the center portion of the display apparatus 1000 is convex in the +z direction and boundaries of the display apparatus 1000 in the +x direction and −x direction are bent in the −x direction, the wrinkles of the first buffer inorganic layer 310 are spread, and occurrence of the wrinkles in the first buffer inorganic layer 310 is effectively prevented. Since the first organic film layer 321 is an organic film layer having excellent flexible characteristics when being bent, cracks do not occur in the first buffer inorganic layer 310 when the display apparatus 1000 is bent.

Also, as described above, even when cracks occur in the fifth inorganic film layer 315 which is provided over an upper portion of the first organic layer 321, the first organic film layer 321 prevents cracks from being transferred to the first buffer inorganic layer 310 which is disposed below the first organic film layer 321.

Also, in the method of manufacturing the display apparatus 1000 according to the exemplary embodiment, all the first buffer organic layer 320, the first buffer inorganic layer 310, the first organic film layer 321, and the fifth inorganic film layer 315 may be provided according to the CVD method, for example. Accordingly, a moving distance of the substrate 100 during the manufacturing process is significantly shortened and the manufacturing process is effectively simplified.

Figure 7:
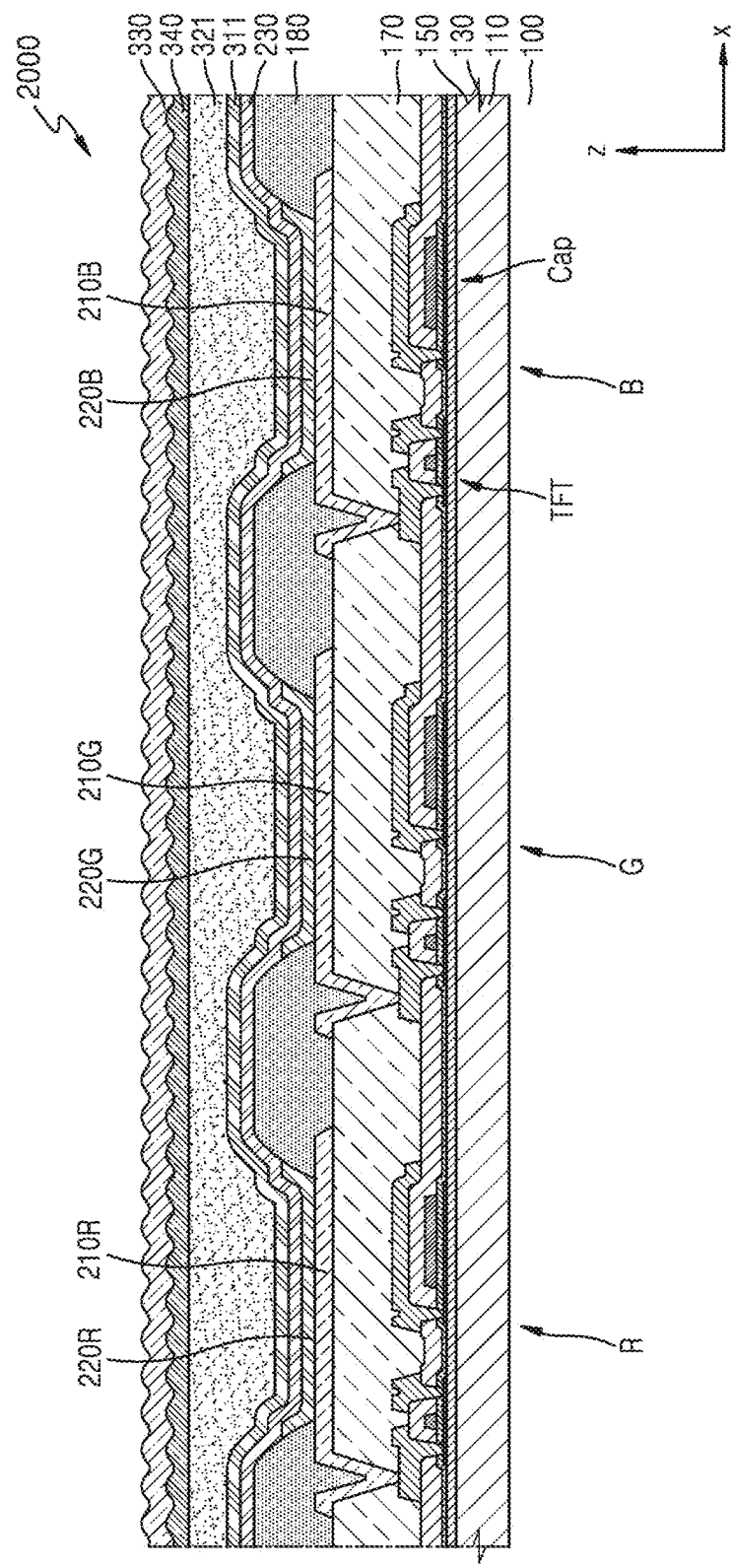
FIG. 7 is a cross-sectional view schematically illustrating another exemplary embodiment of a cross-section of a display apparatus manufactured by a method of manufacturing thereof.

FIG. 7 is a cross-sectional view schematically illustrating a cross-section of a display apparatus manufactured by a method of manufacturing thereof according to another exemplary embodiment. The same references of FIG. 7 as FIG. 6B respectively represent the same elements. Here, duplicate descriptions thereof will be omitted for brief description.

An encapsulating film may be provided to prevent instruction of foreign impurities, such as external oxygen or moisture, into the display element including the pixel electrodes 210R, 210G, and 210B, intermediate layers 220R, 220G, and 220B, and the opposite electrodes 230.

A first inorganic film layer 311 is provided over the opposite electrode 230 and covers the display element. In an exemplary embodiment, the first inorganic film layer 311 may include silicon nitride, silicon oxide, and/or silicon oxynitride, or may include metal oxide, metal nitride, metal oxynitride, or metal carbon. The first inorganic film layer 311 may be provided according to the CVD method and may have a uniform thickness along a curve of the opposite electrode 230 which is disposed below the first inorganic film layer 311, that is, along a curve of a pixel defining film 180.

A first organic film layer 321 may be provided over the first inorganic film layer 311. The first organic film layer 321 may flatten a curve shape of the first inorganic film layer 311.

A second buffer organic layer 340 may be provided over the first organic film layer 321. Here, the second buffer organic layer 340 may have a hardness lower than a hardness of the first organic film layer 321. In an exemplary embodiment, the second buffer organic layer 340 may be provided according to the CVD method using hexamethyldisiloxane acid. When an organic film layer including the hexamethyldisiloxane acid is provided according to the CVD method, an organic film layer may be provided by combining the hexamethyldisiloxane acid, nitrogen monoxide, and helium gas, for example. Here, a hardness of the organic film layer may be controlled by adjusting a ratio of the nitrogen monoxide with respect to the entire gas.

In an exemplary embodiment, even when the first organic film layer 321 and the second buffer organic layer 340 are provided using the entire gas having the same compounds and including the hexamethyldisiloxane acid, the first organic film layer 321 may be provided by the CVD method with a first ratio of monoxide with respect the entire gas, and the second buffer organic layer 340 may be provided by the CVD method with a second ratio different from the first ratio of monoxide with respect to the entire gas, so that a hardness of the first organic film layer 321 and the hardness of the second buffer organic layer 340 may be different from each other, for example. In an exemplary embodiment, the higher ratio of the monoxide, the higher hardness of an organic film layer, for example.

Moreover, even when the first organic film layer 321 and the second buffer organic layer 340 include different materials, the hardness of the second buffer organic layer 340 may be lower than the hardness of the first organic film layer 321. And, a material used to form the second buffer organic layer 340 may not be limited to the hexamethyldisiloxane acid.

In an exemplary embodiment, the second buffer organic layer 340 may be provided using acrylate, for example. In this case, the second buffer organic layer 340 may be disposed on the first organic film layer 321 using the acrylate according to a printing method or a coating method and by adjusting an amount of hardening the acrylate, so that the second buffer organic layer 340 has the lower harness. In detail, when an acrylate layer is hardened, ultraviolet light is irradiated on the acrylate layer to harden the acrylate layer. Here, a brightness of the irradiated ultraviolet light is low, the acrylate layer having a lower hardness is provided. Accordingly, the first organic film layer 321 may be provided by disposing the acrylate layer and hardening the acrylate layer using a first brightness of the ultraviolet light, and the second buffer organic layer 340 may be provided by disposing the acrylate layer and hardening the acrylate layer using a second brightness of the ultraviolet light, so that the second buffer organic layer 340 may be provided to have a lower hardness than a hardness of the first organic film layer 321.

Moreover, when the acrylate layer is hardened, a time period of irradiating the ultraviolet light on the acrylate layer may be controlled to adjust the hardness of the organic film layer. That is, when the first organic film layer 321 is provided by disposing the acrylate layer and hardening the acrylate layer by irradiating the ultraviolet light on the acrylate layer for 340 a first time period, and the second buffer organic layer is provided by disposing the acrylate layer and hardening the acrylate layer by irradiating the ultraviolet light on the acrylate layer for a second time period shorter than a first time period, so that the second buffer organic layer 340 has the lower hardness than the first organic film layer 321.

As such, after the first organic film layer 321 and the second buffer organic layer 340 are provided, a second buffer inorganic layer 330 may be provided over the second buffer organic layer 340 as illustrated in FIG. 7.

In an exemplary embodiment, the second buffer inorganic layer 330 may include silicon nitride, silicon oxide, and/or silicon oxynitride, or may include metal oxide, metal nitride, metal oxynitride, or metal carbon, for example. The second buffer inorganic layer 330 may be provided by the CVD method and may have a uniform thickness.

Here, the second buffer inorganic layer 330 may have a residual stress like as the first buffer inorganic layer 310 (refer to FIG. 6B). Wrinkles having a uniform period may be provided on an upper surface of the second buffer organic layer 340 according to the residual stress of the second buffer inorganic layer 330 as illustrated in FIG. 7, and the second buffer inorganic layer 330 may be curved according to the wrinkles of the upper surface of the second buffer organic layer 340. However, in a method of manufacturing a display apparatus according to another exemplary embodiment, when the first buffer inorganic layer 330 is provided over the second buffer organic layer 340 having the lower hardness, wrinkles having a uniform period may be provided on an upper surface of the second buffer organic layer 340 according to the residual stress, as illustrated in FIG. 7, and the second buffer inorganic layer 330 may be curved according to the wrinkles of the upper surface of the second buffer organic layer 340.

The wrinkles may not be provided on the upper surface of the second buffer organic layer 340 only after the second buffer inorganic layer 330 is provided. That is, the formation of the curved surface of the second buffer inorganic layer 340 may be completed during forming the second buffer inorganic layer 330, depending on a manufacturing process.

As described above, when a display apparatus 2000 is manufactured according to the exemplary embodiment, an encapsulating layer may include the first inorganic film layer 311, the first organic film layer 321, the second buffer organic layer 340, and the second buffer inorganic layer 330. The wrinkles are provided on the upper surface of the second buffer organic layer 340, and the second buffer inorganic layer 330 may be provided along the wrinkles of the upper surface of the second buffer organic layer 340. Accordingly, the display apparatus 2000 may be realized as a flexible display apparatus having excellent characteristics.

That is, occurrence of cracks in the first buffer inorganic layer 310 may be effectively prevented. In a case of the first organic film layer 321, the cracks may not occur when being bent since the first organic film layer 321 has excellent flexible characteristics of an organic film layer.

Also, as described above, even when cracks occur in the first inorganic film layer 311, the first organic film layer 321 having a flat upper surface prevents cracks from being transferred to the second buffer inorganic layer 330 which is disposed below the first organic film layer 321.

Figure 8B:
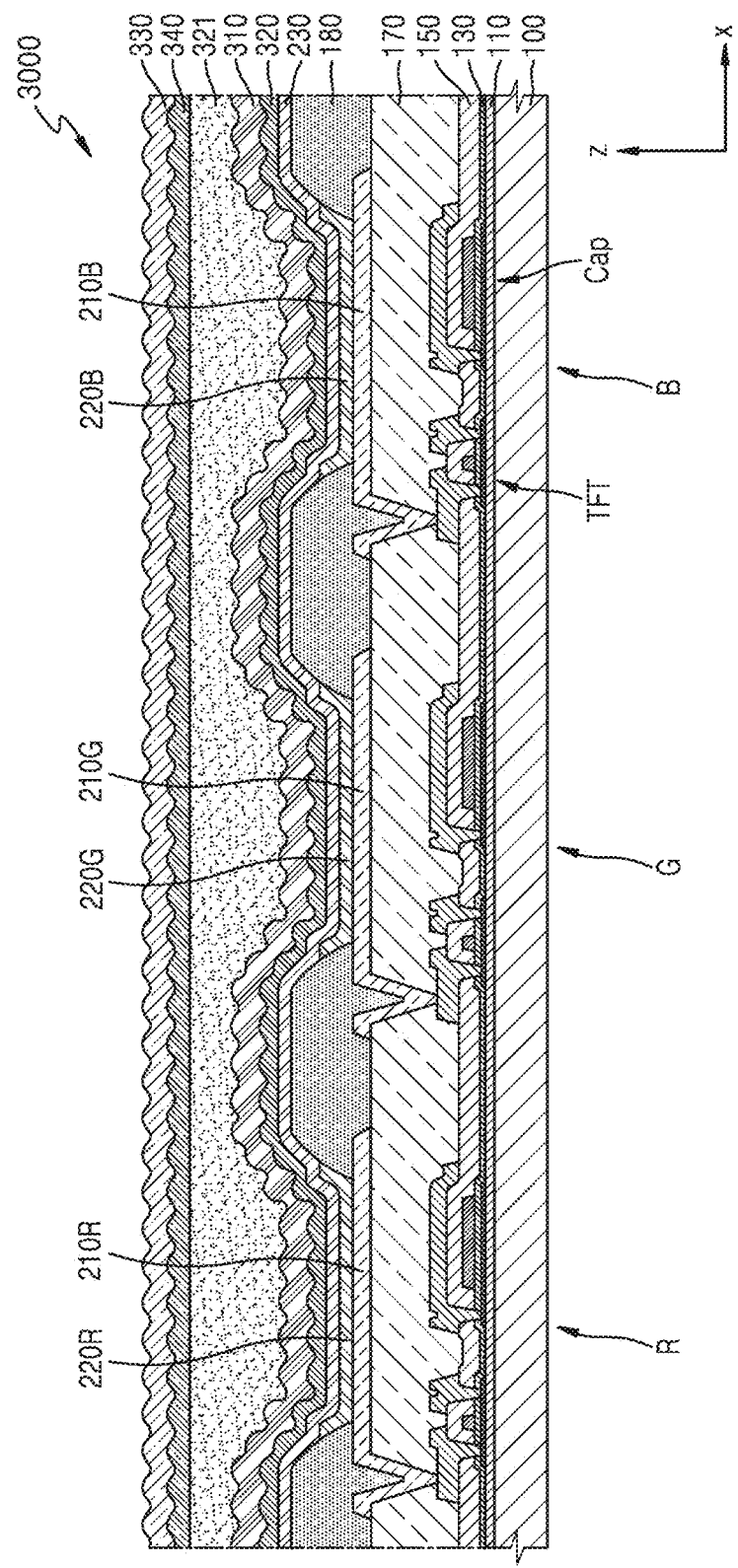

FIGS. 8A and 8B are cross-sectional views schematically illustrating operations of a method of manufacturing a display apparatus according to another exemplary embodiment. The same references of FIGS. 8A and 8B as FIG. 7 respectively represent the same elements. Here, duplicate descriptions thereof will be omitted for brief description.

FIGS. 8A and 8B are cross-sectional views schematically illustrating operations of a method of manufacturing an organic light-emitting display apparatus having an organic light-emitting device as a display element. The invention is not limited to the organic light-emitting display apparatus and may be used to manufacture a display apparatus having different display elements.

Referring to FIG. 8A, a thin film transistor TFT, a plurality of first electrodes 210R, 210G, and 210B, and a pixel defining film 180 to expose at least a portion including a center portion of the respective first electrodes 210R, 210G, and 210B may be provided over a substrate 100. A buffer layer 110 to prevent a permeation of impurities into a semiconductor layer of the thin film transistor TFT, a gate insulating film 130 to insulate the gate electrode from the semiconductor layer of the thin film transistor TFT, an interlayer insulating film 150 to insulate a gate electrode from source/drain electrodes of the thin film transistor TFT, a planarization film 170 covering the thin film transistor and having a flattened upper surface, and other components may be selectively provided in the display apparatus.

After an opposite electrode is provided, an encapsulating film may be provided to prevent a permeation of impurities such as oxygen or moisture into the display element including the pixel electrodes 210R, 210G, and 210B, the intermediate layers 220R, 220G, and 220B, and opposite electrodes 230.

As illustrated in FIG. 8A, a first buffer organic layer 320 is provided over the opposite electrode 230 and covers the display element, and a first buffer inorganic layer 310 may be provided over the first buffer organic layer 320. Since the forming process of the first buffer organic layer 320 and the first buffer inorganic layer 310 may be the same as descriptions of FIG. 6A, duplicate descriptions will be omitted for brief explanation.

That is, in the method of manufacturing different display apparatus according to the invention, when the first buffer organic layer 320 is provided, the first buffer organic layer 320 having a lower hardness may be provided by adjusting an operation condition. The first buffer inorganic layer 310 having a residual stress may be provided over the first buffer organic layer 320 having the lower hardness.

As a result, wrinkles having a uniform period may be provided on an upper surface of the first buffer organic layer 320 according to the residual stress, which remains in the first buffer inorganic layer 310, as illustrated in FIG. 8A, and the first buffer inorganic layer 310 may be curved according to the wrinkles of the upper surface of the first buffer organic layer 320. The wrinkles may not be provided on the upper surface of the first buffer organic layer 320 only after the first buffer inorganic layer 310 is provided. That is, the formation of the curved surface of the first buffer organic layer 320 may be completed during forming the first buffer inorganic layer 310, depending on a manufacturing process.

A first organic film layer 321 may be provided over the first buffer inorganic layer 310. The first organic film layer 321 may flatten a curved shape of the first buffer inorganic layer 310. That is, even when the first buffer inorganic layer 310 is curved along the wrinkles of the upper surface of the first buffer organic layer 320, the first organic film layer 321 may have a flattened upper surface.

Referring to FIG. 8B, a second buffer organic layer 340 may be provided over the first organic film layer 321. Here, the second buffer organic layer 340 has a lower hardness than a hardness of the first organic film layer 321.

In the invention, a process of forming the second buffer organic layer 340, which has a lower hardness than the first organic film layer 321, over the first organic film layer 321 may be same as the process illustrated in FIG. 7, and thus duplicate descriptions thereof will be omitted for convenience.

That is, in a method of manufacturing different display apparatuses, when the first buffer organic layer 320 is provided, the first buffer organic layer 320 may have a lower hardness by adjusting a process condition, and the first buffer inorganic layer 310 having residual stress may be provided over the first buffer organic layer 320 having the low hardness.

Accordingly, as illustrated in FIG. 8B, wrinkles having a uniform period may be provided over an upper surface of the second buffer organic layer 340 due to the residual stress of the second buffer inorganic layer 330, and the second buffer inorganic layer 330 may be curved along the wrinkles of the upper surface of the second buffer organic layer 340. The wrinkles may not be provided on the upper surface of the second buffer organic layer 340 only after the second buffer inorganic layer 330 is provided. That is, the formation of the curved surface of the second buffer organic layer 340 may be completed during forming the second buffer inorganic layer 330, depending on a manufacturing process.

When a display apparatus 3000 is manufactured according to the invention, an encapsulating layer including the first buffer organic layer 320, the first buffer inorganic layer 310, the first organic film layer 321, the second buffer organic layer 340, and the second buffer inorganic layer 330 may be provided.

That is, wrinkles may be provided over upper surfaces of the first buffer organic layer 320 and the second buffer organic layer 340, and the first buffer inorganic layer 310 and the second buffer inorganic layer 330 may be provided along the wrinkles.

That is, wrinkles are provided on the upper surfaces of the first buffer organic layer 320 and the second buffer organic layer 340, and the first buffer inorganic layer 310 and the second buffer inorganic layer 330 are provided along the wrinkles thereof. Accordingly, the flexible display apparatus 3000 having excellent performance may be realized.

That is, in a display apparatus manufactured by the method of manufacturing the same according to the invention, the wrinkles are provided on inorganic layers of the encapsulating layer, and thus occurrence of cracks in the first buffer inorganic layer 310 and the second buffer inorganic layer 330 may be effectively prevented since the wrinkles of the first buffer inorganic layer 310 and the second buffer inorganic layer 330 even when a center portion of the display apparatus is bent to be convex in the +z direction and boundary portions of the display apparatus in the +x direction and the −x direction are bent in the −z direction.

Also, the method of manufacturing the display apparatus according to the invention does not require a separate process to form wrinkles on the upper surface of the organic layer, but the wrinkles may be provided by adjusting the process condition when forming the wrinkles in the first buffer inorganic layer 310 and the second buffer inorganic layer 330. Accordingly, a manufacturing process may be simplified, manufacturing costs are significantly lowered, and a defect ratio may be lowered.

Moreover, in the method of manufacturing the display apparatus according to the invention, the encapsulating film including the first buffer organic layer 320, the first buffer inorganic layer 310, the first organic film layer 321, the second buffer organic layer 340, and the second buffer inorganic layer 330 is provided. In an exemplary embodiment, all of the first buffer organic layer 320 and the second buffer organic layer 340 may be provided using the CVD method, for example. Accordingly, a moving distance of the substrate 100 during the manufacturing process may be significantly reduced, and the manufacturing process may be simplified.

Figure 9:
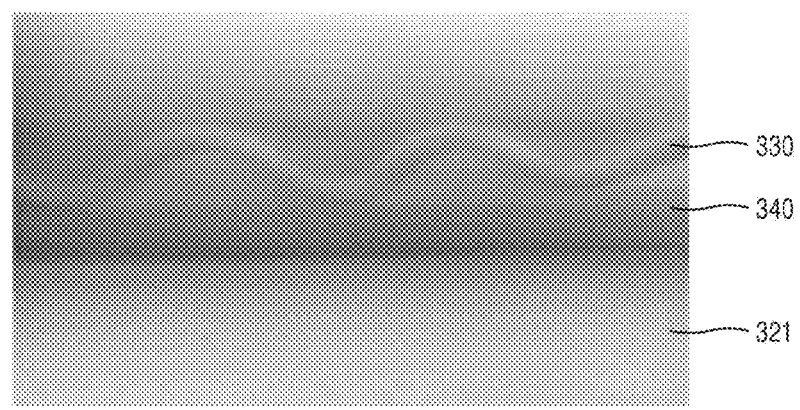
FIG. 9 is a cross-sectional image schematically illustrating another exemplary embodiment of a portion of a display apparatus.

FIG. 9 is a cross-sectional image schematically illustrating a portion of a display apparatus manufactured using the method of FIGS. 8A and 8B. Referring to FIG. 9, the second buffer organic layer 340 is disposed over a flattened upper surface of the first organic film layer 321, wrinkles are provided on the upper surface of the second buffer organic layer 340, and then the second buffer inorganic layer 330 may be provided and may have a shape corresponding to the wrinkles thereof. In FIG. 9, the first organic film layer 321 and the second buffer organic layer 340 all include hexamethyldisiloxane acid.

Particularly, a period of the wrinkles of the upper surface of the second buffer organic layer 340 may be shortened when the hardness of the second buffer organic layer 340 is lowered. According to experiments, the thinner the second buffer organic layer 340, the shorter the period of the wrinkles of the upper surface of the second buffer organic layer 340.

As illustrated in FIG. 8B, when the second buffer organic layer 340 is provided, the first organic film layer 321 may have a thickness less than a minimum thickness, so that the period of the wrinkles is shortened.

Figure 10:
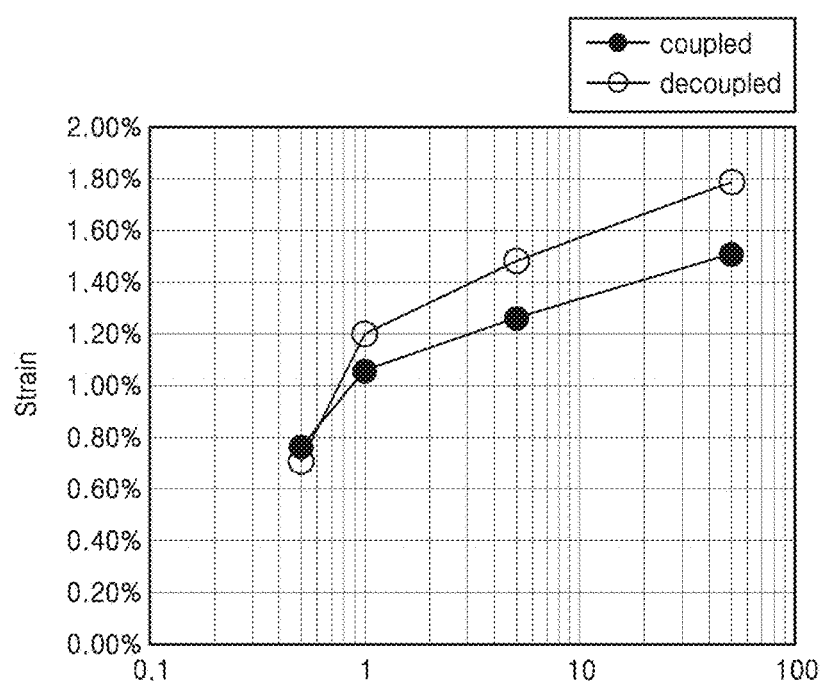
FIG. 10 is a graph illustrating exemplary embodiments of a deformation ratio value of an inorganic film layer, compared to a period of wrinkles provided on an inorganic film layer in respective display apparatuses manufactured by corresponding methods of manufacturing the same.

FIG. 10 is a graph illustrating a deformation ratio value of an inorganic film layer, compared to a period of wrinkles provided on the inorganic film layer in respective display apparatuses manufactured by corresponding methods of manufacturing the same according to embodiments.

Values of "coupled" indicated by block dots represent experimental values of the display apparatus provided with the wrinkles on all the inorganic films of the encapsulating film. That is, as the experimental values of the display apparatus 3000 illustrated in FIG. 8B, the encapsulating film of the display apparatus 3000 may include the first buffer inorganic layer 310 provided with the wrinkles and the second buffer inorganic layer 330 provided with the wrinkles.

Values of "coupled" indicated by white dots represent experimental values of the display apparatus provided with the wrinkles on any one of the inorganic films of the encapsulating film. That is, as the experimental values may be experimental values of the display apparatus 1000 of FIG. 6B or the display apparatus 2000 of FIG. 7.

In other words, the experimental values may be the experimental values of the encapsulating film of the display apparatus 1000 including the first buffer inorganic layer 310 provided with the wrinkles or the experimental values of the encapsulating film of the display apparatus 2000 including the second buffer inorganic layer 330.

When the period of the provided wrinkles of an inorganic film layer in an X axis is less than 1, a value of strain (%) in a Y axis shows that the "decoupled" value indicated by the white dot is less than the "coupled" value indicated by the black dots.

That is, in a case of "decoupled" in the display apparatus including the wrinkles which are provided on one of the inorganic films of the encapsulating film, the value of the strain (%) becomes small, and thus an occurrence ratio of the cracks in the inorganic film layer is low, and a defect ratio may be effectively lowered.

In other words, in the display apparatus 1000 including the first buffer inorganic layer 310 provided with the wrinkles of a short period or the display apparatus 2000 including the second buffer inorganic layer 330 provided with the wrinkles of a short period, cracks do not occur and defect ratio is significantly lowered even when the display apparatuses 1000 and 2000 are deformed.

When the period of the provided wrinkles of an inorganic film layer in the X axis is greater than 1, a value of strain (%) in the Y axis shows that the "coupled" value indicated by the black dot is less than the "decoupled" value indicated by the white dots.

That is, when the period of the wrinkles becomes greater and when the cracks are provided on all the plurality of inorganic films, the value of strain (%) becomes small, and thus probability of occurrence of the cracks is lowered and the defect ratio is significantly lowered.

In other words, when the period of the wrinkles is greater than 1 and when the wrinkles are provided all of the first buffer inorganic layer 310 and the second buffer inorganic layer 330 of the encapsulating film as the display apparatus 3000 illustrated in FIG. 8B, the cracks may not occur and the defect ratio may be lowered.

It should be understood that exemplary embodiments described herein should be considered in a descriptive sense only and not for purposes of limitation. Descriptions of features or exemplary embodiments within each exemplary embodiment should typically be considered as available for other similar features or exemplary embodiments in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A display apparatus comprising:
   a substrate;
   a display element disposed on the substrate;
   a first inorganic film layer covering the display element;
   a first organic film layer disposed directly on the first inorganic film layer;
   a second organic film layer disposed on the first organic film layer and comprising a wrinkled upper surface and a flat lower surface contacting a flat upper surface of the first organic film layer such that a thickness of the second organic film layer varies; and
   a second inorganic film layer disposed on the second organic film layer and comprising a shape corresponding to the wrinkled upper surface of the second organic film layer.

2. The display apparatus of claim 1, wherein the second organic film layer comprises one of hexamethyldisiloxane and polyacrylate.

3. The display apparatus of claim 1, wherein a minimum thickness of the first organic film layer is greater than a maximum thickness of the second organic film layer.

4. The display apparatus of claim 1, wherein a thickness of the second inorganic film layer is uniform.

5. The display apparatus of claim 1, wherein a hardness of the first organic film layer is greater than a hardness of the second organic film layer.

6. A method of manufacturing a display apparatus, the method comprising:
   forming a display element on a substrate;
   forming a first inorganic film layer to cover the display element;
   forming a first organic film layer on the first inorganic film layer, the first organic film layer comprising a flat upper surface;
   forming a second organic film layer directly on the first organic film layer; and
   forming a second inorganic film layer on the second organic film layer, such that an upper surface of the second organic film is uneven and a lower surface of the second organic film is flat such that a thickness of the second organic film layer varies, and then the second inorganic film layer comprises a shape corresponding to the uneven upper surface of the second organic film layer.

7. The method of claim 6, wherein the forming the second organic film layer comprises forming the second organic film layer using one of hexamethyldisiloxane and polyacrylate.

8. The method of claim 6, wherein the second organic film layer comprising a hardness lower than a hardness of the first organic film layer.

9. The method of claim 8, wherein:
   the forming the first organic film layer comprises forming the first organic film layer including hexamethyldisiloxane according to a chemical vapor deposition method in a first ratio of $N_2O$ in an entire gas; and
   the forming the second organic film layer comprises forming the second organic film layer including the hexamethyldisiloxane according to the chemical vapor deposition method in a second ratio of $N_2O$, which is different from the first ratio of $N_2O$ in the entire gas.

10. The method of claim 6, wherein the forming the second organic film layer comprises forming the second organic film layer using acrylate.

11. The method of claim 8, wherein:
    the forming the first organic film layer comprises forming an acrylate layer and irradiating the acrylate layer with a first illumination of ultraviolet light to harden the acrylate layer; and
    the forming the second organic film layer comprises forming another acrylate layer and irradiating the another acrylate layer with a second illumination of ultraviolet light, which is less than the first illumination of ultraviolet light, to harden the another acrylate layer.

12. The method of claim 8, wherein:
    the forming the first organic film layer comprises forming an acrylate layer and irradiating the acrylate layer with ultraviolet light for a first time period to harden the acrylate layer; and
    the forming the second organic film layer comprises forming another acrylate layer and irradiating the another acrylate layer with the ultraviolet light for a second time period, which is shorter than the first time period, to harden the another acrylate layer.

13. The method of claim 8, wherein the forming the second organic film layer comprises forming the second organic film layer having a maximum thickness which is less than a minimum thickness of the first organic film layer.

14. A display apparatus comprising:
    a substrate;
    a display element disposed over the substrate;
    a first buffer organic layer covering the display element and comprising wrinkles provided on an upper surface thereof and not provided on a lower surface thereof such that a thickness of the first buffer organic layer varies;
    a first buffer inorganic layer disposed over the first buffer organic layer and having a shape corresponding to a shape of the upper surface of the first buffer organic layer; and
    a first organic film layer disposed over the first buffer inorganic layer and including a flattened upper surface.

15. The display apparatus of claim 14, further comprising:
    a second buffer organic layer disposed over the first organic film layer and including wrinkles provided on an upper surface thereof; and
    a second buffer inorganic layer disposed over the second buffer organic layer and having a shape corresponding to a shape of the upper surface of the second buffer organic layer.

16. The display apparatus of claim 14, further comprising:
    an inorganic film layer disposed over the first organic film layer and including a flattened upper surface.

17. The display apparatus of claim 14, wherein the first buffer organic layer comprises one of hexamethyldisiloxane acid and polyacylate.

18. The display apparatus of claim 15, wherein the second buffer organic layer comprises one of hexamethyldisiloxane acid and polyacylate.

19. The display apparatus of claim 15, wherein the first buffer inorganic layer and the second buffer inorganic layer comprise a uniform thickness.

20. The display apparatus of claim 15, wherein a hardness of the first organic film layer is greater than a hardness of the second buffer organic layer.

21. A method of manufacturing a display apparatus, the method comprising:
forming a display element over a substrate;
forming a first buffer organic layer covering the display element, the first buffer organic layer comprising wrinkles provided on an upper surface thereof and not provided on a lower surface thereof such that a thickness of the first buffer organic layer varies;
forming a first buffer inorganic layer over the first buffer organic layer, the first buffer inorganic layer comprising a shape corresponding to a shape of the upper surface of the first buffer organic layer; and
forming a first organic film layer over the first buffer inorganic layer, the first organic film layer comprising a flattened upper surface.

22. The method of claim 21, wherein:
the forming the first organic film layer comprises forming the first organic film layer comprising hexamethyldisiloxane acid according to a chemical vapor deposition method using a first ratio of $N_2O$ in an entire gas; and
the forming the first buffer organic layer comprises forming the first buffer organic layer comprising hexamethyldisiloxane acid according to the chemical vapor deposition method using a second ratio of $N_2O$ in the entire gas.

23. The method of claim 21, wherein the forming the first buffer organic layer comprises forming the first buffer organic layer using acrylate.

24. The method of claim 21, wherein:
the forming the first organic film layer comprises disposing an acrylate layer and hardening the acrylate layer using ultraviolet light of a first brightness; and
the forming the first buffer organic layer comprises disposing an acrylate layer and hardening the acrylate layer using ultraviolet of a second brightness lower than the first brightness.

25. The method of claim 21, wherein:
the forming the first organic film layer comprises disposing an acrylate layer and irradiating ultraviolet light on the acrylate layer for a first time period; and
the forming the first buffer organic layer comprises disposing an acrylate layer and irradiating ultraviolet light on the acrylate layer for a second time period shorter than the first time period.

26. The method of claim 21, further comprising:
forming a second buffer organic layer over the first organic film layer wherein the second buffer organic layer has a hardness lower than that of the first organic film layer.

27. The method of claim 26, further comprising:
forming a second buffer inorganic layer over the second buffer organic layer such that wrinkles are provided on an upper surface of the second buffer organic layer, and the second buffer inorganic layer comprises a shape corresponding to a wrinkle shape of the second buffer organic layer.

28. The method of claim 26, wherein:
the forming the first organic film layer comprises forming the first organic film layer comprising hexamethyldisiloxane acid according to a chemical vapor deposition method using a first ratio of $N_2O$ in an entire gas; and
the forming the second buffer organic layer comprises forming the second buffer organic layer comprising hexamethyldisiloxane acid according to the chemical vapor deposition method using a second ratio of $N_2O$ in the entire gas, the second ratio being different from the first ratio.

29. The method of claim 26, wherein the forming the second buffer organic layer comprises forming the second buffer organic layer using acrylate.

30. The method of claim 26, wherein:
the forming the first organic film layer comprises disposing an acrylate layer and hardening the acrylate layer using ultraviolet light of a first brightness; and
the forming the second buffer organic layer comprises disposing an acrylate layer and hardening the acrylate layer using ultraviolet of a second brightness lower than the first brightness.

31. The method of claim 26, wherein:
the forming the first organic film layer comprises disposing an acrylate layer and irradiating ultraviolet light on the acrylate layer for a first time period; and
the forming the second buffer organic layer comprises disposing an acrylate layer and irradiating ultraviolet light on the acrylate layer for a second time period shorter than the first time period.

32. The method of claim 21, further comprising:
forming an inorganic film over the first organic layer, the inorganic film comprising a flattened upper surface.

* * * * *